US012567465B2

(12) United States Patent　　(10) Patent No.: US 12,567,465 B2
Yamakita　　(45) Date of Patent: Mar. 3, 2026

(54) SEMICONDUCTOR DEVICE

(71) Applicant: Kioxia Corporation, Tokyo (JP)

(72) Inventor: Shigehiro Yamakita, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 187 days.

(21) Appl. No.: 18/593,979

(22) Filed: Mar. 4, 2024

(65) Prior Publication Data

US 2024/0321358 A1　Sep. 26, 2024

(30) Foreign Application Priority Data

Mar. 23, 2023　(JP) ................................. 2023-046861

(51) Int. Cl.
| | |
|---|---|
| *G11C 16/30* | (2006.01) |
| *G11C 5/06* | (2006.01) |
| *G11C 16/04* | (2006.01) |
| *G11C 16/08* | (2006.01) |
| *G11C 16/10* | (2006.01) |
| *G11C 16/26* | (2006.01) |
| *H10B 41/20* | (2023.01) |
| *H10B 41/35* | (2023.01) |
| *H10B 41/41* | (2023.01) |

(52) U.S. Cl.
CPC .......... *G11C 16/0483* (2013.01); *G11C 5/063* (2013.01); *G11C 16/08* (2013.01); *G11C 16/10* (2013.01); *G11C 16/26* (2013.01); *H10B*

*41/20* (2023.02); *H10B 41/35* (2023.02); *H10B 41/41* (2023.02); *G11C 16/30* (2013.01)

(58) Field of Classification Search
CPC ......... G11C 16/30; G11C 16/28; G11C 16/04; G11C 16/26
See application file for complete search history.

(56) References Cited

U.S. PATENT DOCUMENTS

2012/0275226 A1* 11/2012 Nakamura ............. G11C 16/30
365/185.21
2021/0296236 A1 9/2021 Shirai

FOREIGN PATENT DOCUMENTS

JP　2021-150501 A　9/2021
TW　202137510 A　10/2021

* cited by examiner

*Primary Examiner* — Jason Lappas
(74) *Attorney, Agent, or Firm* — Kim & Stewart LLP

(57)　　ABSTRACT

A semiconductor device includes a first semiconductor layer, a plurality of first transistors provided on the first semiconductor layer, an insulating layer provided on the first semiconductor layer and covering the plurality of first transistors, a second semiconductor layer provided in the insulating layer, a plurality of second transistors provided on the second semiconductor layer, and a separation layer that extends through the second semiconductor layer between the plurality of second transistors to separate the plurality of second transistors from each other.

20 Claims, 12 Drawing Sheets

Y DIRECTION
X DIRECTION

Y DIRECTION
X DIRECTION

*FIG. 7A*

Y DIRECTION ←—●—→ X DIRECTION

*FIG. 7B*

Y DIRECTION ←—●—→ X DIRECTION

*FIG. 7C*

Y DIRECTION ←—●—→ X DIRECTION

Y DIRECTION ⊙ X DIRECTION

Y DIRECTION ⊙ X DIRECTION

Y DIRECTION          X DIRECTION

FIG. 12

SEMICONDUCTOR DEVICE

CROSS-REFERENCE TO RELATED APPLICATION(S)

This application is based upon and claims the benefit of priority from Japanese Patent Application No. 2023-046861, filed Mar. 23, 2023, the entire contents of which are incorporated herein by reference.

FIELD

Embodiments described herein relate generally to a semiconductor device.

BACKGROUND

A semiconductor device in which a plurality of transistors are provided on a semiconductor substrate is known. As the size of the semiconductor device is reduced, the layout area for these transistors also needs to be reduced. However, there is a limit to further increasing the density of a plurality of transistors because it increases the difficulty of manufacturing the semiconductor device.

DESCRIPTION OF THE DRAWINGS

FIGS. 7A to 7C are diagrams sequentially showing a part of a procedure of a method for manufacturing the semiconductor device according to the embodiment.

FIG. 12 is a sectional view showing a schematic configuration example of the semiconductor device of another embodiment.

DETAILED DESCRIPTION

Embodiments provide a semiconductor device that has a reduced size without the density of transistors being excessively increased.

In general, according to one embodiment, the semiconductor device includes a first semiconductor layer, a plurality of first transistors provided on the first semiconductor layer, an insulating layer provided on the first semiconductor layer and covering the plurality of first transistors, a second semiconductor layer provided in the insulating layer, a plurality of second transistors provided on the second semiconductor layer, and a separation layer that extends through the second semiconductor layer between the plurality of second transistors to separate the plurality of second transistors from each other.

Hereinafter, embodiments of the present disclosure will be described in detail with reference to the drawings. Further, the present disclosure is not limited to the following embodiments. The elements in the following embodiments include those that can be easily assumed by those skilled in the art or those that are substantially the same.

Circuit Configuration of Semiconductor Device

First, an example of a circuit configuration of the semiconductor device of the embodiment will be described with reference to FIGS. 1 to 4.

Overall Configuration of Semiconductor Device

Figure 1:
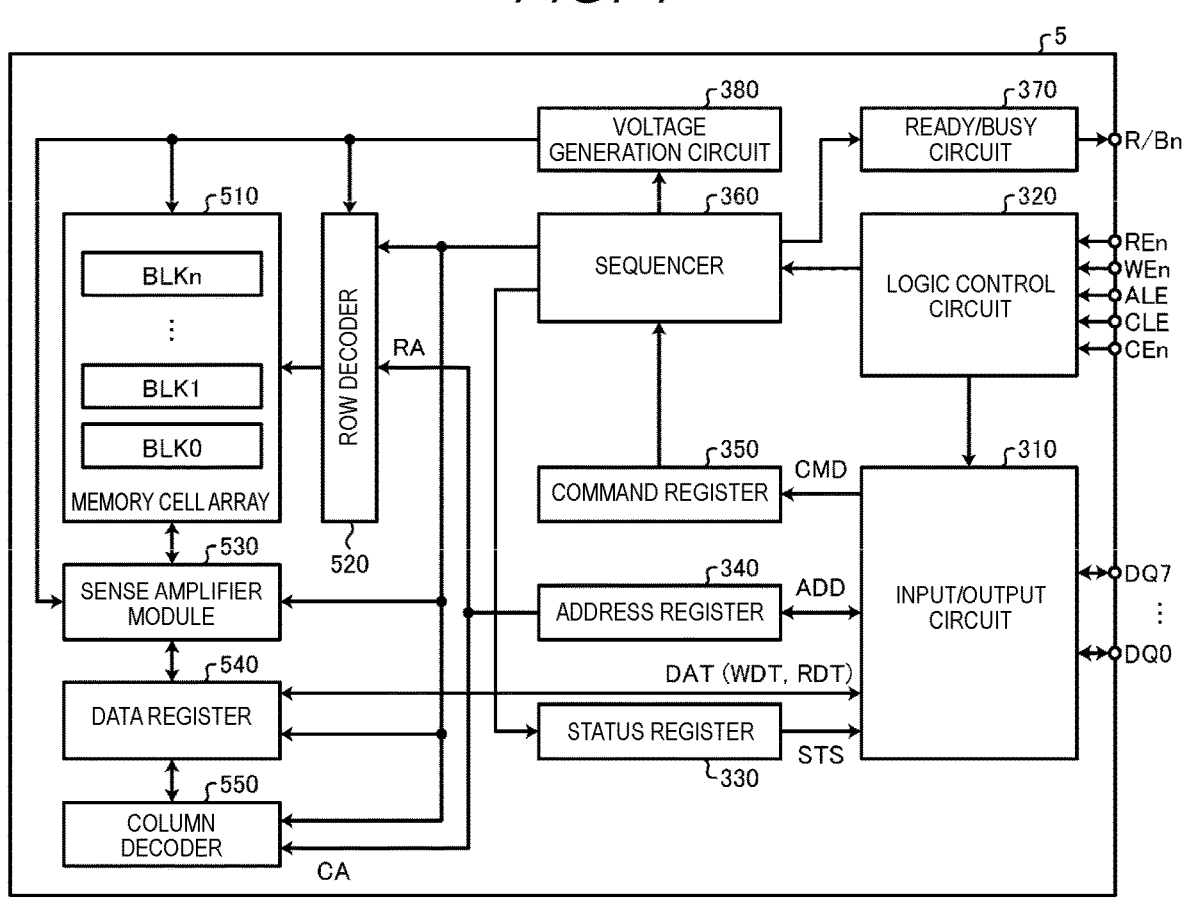
FIG. 1 is a block diagram of a semiconductor device according to an embodiment.

FIG. 1 is a block diagram of a semiconductor device 1 according to an embodiment. As shown in FIG. 1, the semiconductor device 1 includes an input/output circuit 310, a logic control circuit 320, a status register 330, an address register 340, a command register 350, a sequencer 360, a ready/busy circuit 370, a voltage generation circuit 380, a memory cell array 510, a row decoder 520, a sense amplifier module 530, a data register 540, and a column decoder 550.

Input/output circuit 310 controls the exchange of the input and output of signal DQ with an external device such as a memory controller (not shown) that controls the semiconductor device 1. The input/output circuit 310 includes an input circuit and an output circuit (not shown).

The input circuit transmits the data DAT such as the write data WDT received from the external device to the data register 540, transmits the address ADD to the address register 340, and transmits the command CMD to the command register 350.

The output circuit transmits the status information STS received from the status register 330, the data DAT such as the read data RDT received from the data register 540, and the address ADD received from the address register 340 to the external device.

The logic control circuit 320 receives, for example, a chip enable signal CEn, a command latch enable signal CLE, an address latch enable signal ALE, a write enable signal WEn, and a read enable signal REn from an external device. Further, the logic control circuit 320 controls the input/output circuit 310 and the sequencer 360 according to the received signal.

The status register 330 temporarily stores, for example, the status information STS in a write operation, a read operation, and an erasing operation of data, and notifies the external device whether the operation is successfully completed.

The address register 340 temporarily stores the address ADD received from the external device via the input/output circuit 310. Further, the address register 340 transfers the row address RA to the row decoder 520 and transfers the column address CA to the column decoder 550.

The command register 350 temporarily stores the command CMD received from the external device via the input/output circuit 310 and transfers the command CMD to the sequencer 360.

The sequencer 360 controls the operation of the semiconductor device 1. More specifically, the sequencer 360 controls, for example, the status register 330, the ready/busy circuit 370, the voltage generation circuit 380, the row decoder 520, the sense amplifier module 530, the data register 540, the column decoder 550, and the like in accordance with the command CMD stored in the command register 350, and executes a write operation, a read operation, an erasing operation, and the like.

The ready/busy circuit 370 transmits the ready/busy signal R/Bn to the external device in accordance with the operation status of the sequencer 360.

The voltage generation circuit 380 generates voltage required for a write operation, a read operation, and an erasing operation in accordance with the control of the sequencer 360, and supplies the generated voltage to, for example, the memory cell array 510, the row decoder 520, the sense amplifier module 530, and the like. The row decoder 520 and the sense amplifier module 530 apply the voltage supplied from the voltage generation circuit 380 to the memory cells in the memory cell array 510.

The memory cell array 510 includes a plurality of blocks BLK (BLK0 to BLKn), where n is an integer of 2 or more. The block BLK is a set of a plurality of memory cells associated with a bit line and a word line, and is, for example, a data erasure unit. The memory cell is configured as, for example, a transistor and stores data in a nonvolatile manner.

By providing such a memory cell, the semiconductor device 1 is configured as, for example, a NAND-type nonvolatile memory.

The row decoder 520 decodes the row address RA. The row decoder 520 selects any of the blocks BLK based on the decoding result. The row decoder 520 applies the necessary voltage to the block BLK.

The sense amplifier module 530 is controlled to determine data stored in the memory cell array 510 during a read operation. The sense amplifier module 530 transmits the read data RDT to the data register 540. During a write operation, the sense amplifier module 530 is controlled in accordance with the write data WDT to be written to the memory cell array 510.

The data register 540 includes a plurality of latch circuits. The latch circuit stores write data WDT and read data RDT. For example, in the write operation, the data register 540 temporarily stores the write data WDT received from the input/output circuit 310 and transmits the write data WDT to the sense amplifier module 530. Further, for example, in the read operation, the data register 540 temporarily stores the read data RDT received from the sense amplifier module 530 and transmits the read data RDT to the input/output circuit 310.

The column decoder 550 decodes the column address CA, for example, during a write operation, a read operation, and an erasing operation, and selects the latch circuit in the data register 540 according to the decoding result.

Additionally, a circuit group provided around the memory cell array 510 is also referred to as a peripheral circuit. The peripheral circuit includes at least the row decoder 520, the sense amplifier module 530, the data register 540, and the column decoder 550. The peripheral circuit may include the status register 330, the address register 340, the command register 350, and the sequencer 360, and may further include the input/output circuit 310, the logic control circuit 320, the ready/busy circuit 370, and the voltage generation circuit 380.

As described above, the semiconductor device 1 includes a memory cell array 510 including a plurality of memory cells and a peripheral circuit that performs operations on the plurality of memory cells.

Circuit Configuration of Memory Cell Array

Figure 2:
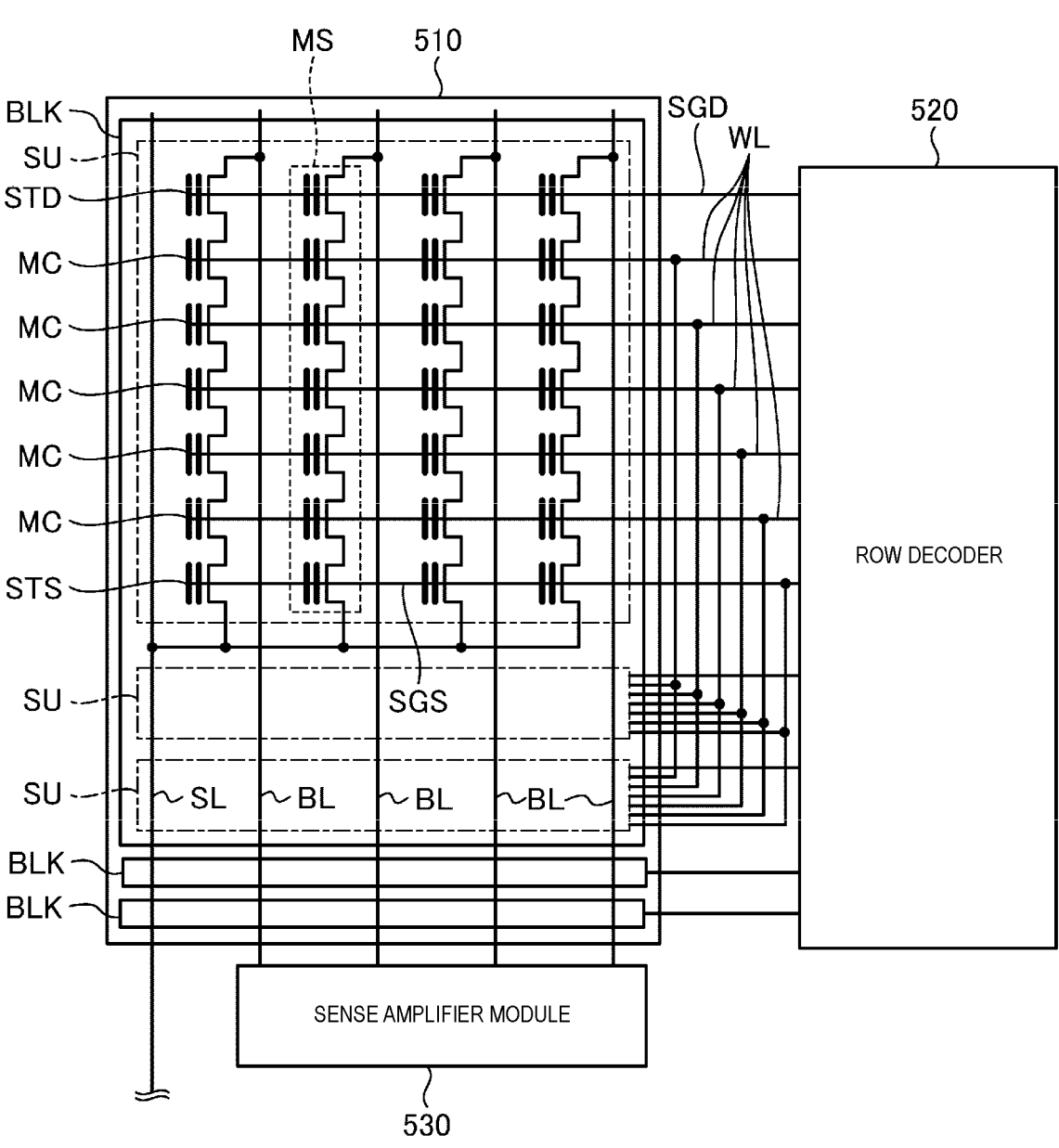
FIG. 2 is an equivalent circuit diagram showing an example of a configuration of a memory cell array provided in the semiconductor device according to the embodiment.

FIG. 2 is an equivalent circuit diagram showing an example of a configuration of a memory cell array 510 provided in the semiconductor device 1 according to the embodiment.

The memory cell array 510 includes a plurality of blocks BLK as described above. Each of the plurality of blocks BLK includes a plurality of string units SU. Each of the plurality of string units SU includes a plurality of memory strings MS. One end of each of the plurality of memory strings MS is connected to a peripheral circuit such as the sense amplifier module 530 via a bit line BL. The other end of each of the plurality of memory strings MS is connected to the peripheral circuit PC via a common source line SL.

The memory string MS includes a drain select transistor STD that is connected in series between the bit line BL and the source line SL with a plurality of memory cells MC and a source select transistor STS. Hereinafter, the drain select transistor STD and the source select transistor STS may be simply referred to as select transistors (STD, STS).

The memory cell MC is, for example, a field effect transistor (FET) including a charge storage layer in a gate insulating layer. The threshold voltage of the memory cell MC changes in accordance with the charge quantity in the charge storage layer. By providing one or a plurality of threshold voltages, the memory cell MC may be able to store one bit or a plurality of bits of data. Word lines WL are respectively connected to the gate electrodes of the plurality of memory cells MC corresponding to one memory string MS. Each of these word lines WL is commonly connected to the corresponding memory cell MC in all the memory strings MS in one block BLK.

The select transistors (STD, STS) are, for example, field effect transistors. The select gate lines (SGD, SGS) are connected to the gate electrodes of the select transistors (STD, STS). The drain select line SGD connected to the drain select transistor STD is provided corresponding to the string unit SU, and is commonly connected to the drain select transistor STD in all the memory strings MS in one string unit SU. The source select line SGS connected to the source select transistor STS is commonly connected to the source select transistor STS in all of the memory strings MS in one block BLK.

One end of the word lines WL and the select gate lines (SGD, SGS) are respectively connected to a peripheral circuit such as a row decoder 520.

Circuit Configuration of Sense Amplifier Module

Figure 3:
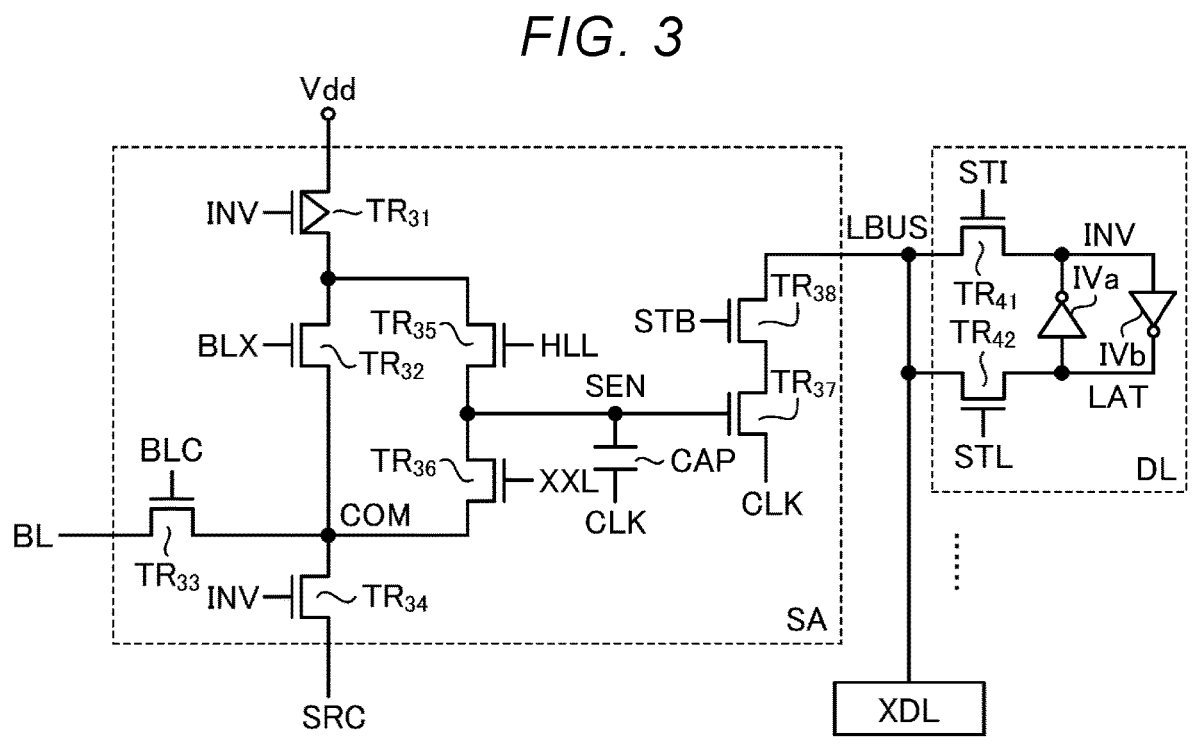
FIG. 3 is a circuit diagram showing an example of a configuration of a sense amplifier circuit and a latch circuit provided in the semiconductor device according to the embodiment.

FIG. 3 is a circuit diagram showing an example of a configuration of a sense amplifier circuit SA and latch circuits DL and XDL provided in the semiconductor device 1 according to the embodiment.

The above-described sense amplifier module 530 is configured with a plurality of sense amplifier circuits SA provided for each bit line BL. For example, in the read operation, each sense amplifier circuit SA is controlled to sense the bit line BL corresponding to the memory cell to be read, and determine whether the data stored in the memory cell is "0" or "1".

In addition, the above-described data register 540 includes a plurality of latch circuits DL and XDL corresponding to the plurality of sense amplifier circuits SA. The latch circuit XDL is also provided for each bit line BL. Meanwhile, a plurality of latch circuits DL are provided for corresponding sense amplifier circuits SA. In this case, the number of latch circuits DL is designed based on, for example, the number of bits of data that can be stored by one memory cell MC. The latch circuits DL and XDL temporarily store data associated with corresponding bit lines BL.

FIG. 3 shows one sense amplifier circuit SA in the sense amplifier module 530 and one latch circuit DL and XDL in the data register 540. The plurality of control signals supplied to the sense amplifier circuit SA and the like are controlled by the sequencer 360.

As shown in FIG. 3, the sense amplifier circuit SA includes transistors $TR_{31}$ to $TR_{38}$ and a capacitor CAP. In FIG. 3, the transistor $TR_{31}$ is a low breakdown voltage P-channel metal-oxide-semiconductor (MOS) transistor. The transistors $TR_{32}$ to $TR_{38}$ are low breakdown voltage N-channel MOS transistors.

A low breakdown voltage CMOS transistor, which may be a low breakdown voltage P-channel MOS transistor or a low breakdown voltage N-channel MOS transistor, is a transistor to which a relatively low voltage is applied, and is also referred to as a low voltage (LV: Low Voltage, VLV: Very Low Voltage) MOS transistor.

One end of the transistor $TR_{31}$ is connected to a power supply line to which the power supply voltage Vdd is supplied, and the gate electrode of the transistor $TR_{31}$ is connected to the node INV. One end of the transistor $TR_{32}$ is connected to the other end of the transistor $TR_{31}$, the other end of the transistor $TR_{32}$ is connected to the node COM, and the control signal BLX is input to the gate electrode of the transistor $TR_{32}$. One end of the transistor $TR_{33}$ is connected to the node COM, the other end of the transistor $TR_{33}$ is connected to the corresponding bit line BL, and the control signal BLC is input to the gate electrode of the transistor $TR_{33}$.

One end of the transistor $TR_{34}$ is connected to the node COM, the other end of the transistor $TR_{34}$ is connected to the node SRC, and the gate electrode of the transistor $TR_{34}$ is connected to the node INV.

One end of the transistor $TR_{35}$ is connected to the other end of the transistor $TR_{31}$, the other end of the transistor $TR_{35}$ is connected to the node SEN, and the control signal HLL is input to the gate electrode of the transistor $TR_{35}$. One end of the transistor $TR_{36}$ is connected to the node SEN, the other end of the transistor $TR_{36}$ is connected to the node COM, and the control signal XXL is input to the gate electrode of the transistor $TR_{36}$.

The clock CLK is input to one end of the transistor $TR_{37}$, and the gate electrode of the transistor $TR_{37}$ is connected to the node SEN. One end of the transistor $TR_{38}$ is connected to the other end of the transistor $TR_{37}$, the other end of the transistor $TR_{38}$ is connected to the bus LBUS, and the control signal STB is input to the gate electrode of the transistor $TR_{38}$. One end of the capacitor CAP is connected to the node SEN, and the clock CLK is input to the other end of the capacitor CAP.

The latch circuit DL includes inverters IVa and IVb and transistors $TR_{41}$ and $TR_{42}$. In FIG. 3, the transistors $TR_{41}$ and $TR_{42}$ are low breakdown voltage N-channel MOS transistors. Hereinafter, the transistors $TR_{41}$ and $TR_{42}$ provided in the data register 540 may be simply referred to as transistors TR.

While FIG. 3 shows one latch circuit DL, the other latch circuits DL also have the same configuration.

The inverter IVa has an input terminal connected to the node LAT and an output terminal connected to the node INV. The inverter IVb has an input terminal connected to the node INV and an output terminal connected to the node LAT.

The transistor $TR_{41}$ has one end connected to the node INV, the other end connected to the bus LBUS, and the control signal STI input to the gate electrode. The transistor $TR_{42}$ has one end connected to the node LAT, the other end connected to the bus LBUS, and the control signal STL input to the gate electrode.

The latch circuit XDL has substantially the same configuration as the latch circuit DL, for example, and is connected to the bus LBUS so that data can be communicated by the sense amplifier circuit SA and the latch circuit DL. The latch circuit XDL is connected to the above-described input/output circuit 310 and is used for input and output of data between the sense amplifier circuit SA and the input/output circuit 310.

The latch circuit XDL is also used for a cache operation of the semiconductor device 1. That is, even when all the latch circuits DL corresponding to the sense amplifier circuits SA are in use, the semiconductor device 1 can receive data from the outside as long as the latch circuit XDL is vacant.

As described above, the sense amplifier circuit SA and the latch circuits DL and XDL belonging to the peripheral circuit include a plurality of transistors TR.

Next, the operation of the sense amplifier circuit SA having the above configuration will be briefly described.

As an example of a case where data is written to the memory cell MC, when injecting charge into the memory cell MC to increase the threshold value, an "H" state (data of "1") is stored in the node INV of the latch circuit DL. As a result, the transistor $TR_{34}$ is turned on, and the bit line BL is set to 0 V.

As another example of the case where data is written to the memory cell MC, when the threshold value is not changed so that charge is not injected into the memory cell MC, an "L" state (data of "O") is stored in the node INV of the latch circuit DL. As a result, the transistor $TR_{31}$ is turned on, and a predetermined positive voltage is applied to the bit line BL.

When reading, the node INV is set to the "L" level, and the transistor $TR_{31}$ is turned on. Further, the bit line BL is precharged by transistor $TR_{31}$, via the transistors $TR_{32}$ and $TR_{33}$. In addition, the transistor $TR_{35}$ is also turned on, and the node SEN is charged to a predetermined potential.

Thereafter, the transistor $TR_{35}$ is turned off, the signal XXL is set to the "H" state, and the transistor $TR_{36}$ is turned on. As a result, when the corresponding memory cell MC is turned on as a result of a voltage applied to its gate through the corresponding word line, the potential of the node SEN is lowered, and the transistor $TR_{37}$ is turned off. On the other hand, when the corresponding memory cell MC is not turned on as a result of the voltage applied to its gate through the corresponding word line, the potential of the node SEN is maintained at the "H" state, and the transistor $TR_{37}$ is turned on.

In addition, the transistor $TR_{38}$ is turned on by the signal STB, the potential corresponding to the on/off of the transistor $TR_{37}$ is transmitted to the bus LBUS, and is stored in the latch circuit DL.

The circuit configuration of the sense amplifier circuit SA and the latch circuits DL and XDL shown in FIG. 3 is an example, and the sense amplifier circuit SA and the latch circuits DL and XDL can adopt various configurations in addition to the above. Therefore, the number and type of the transistors TR provided in each of the sense amplifier circuit SA and the latch circuits DL and XDL may also vary. For example, the sense amplifier circuit SA and the latch circuits DL and XDL may include a high breakdown voltage P-channel MOS transistor, a high breakdown voltage N-channel MOS transistor, or the like.

Circuit Configuration of Row Decoder

Figure 4:
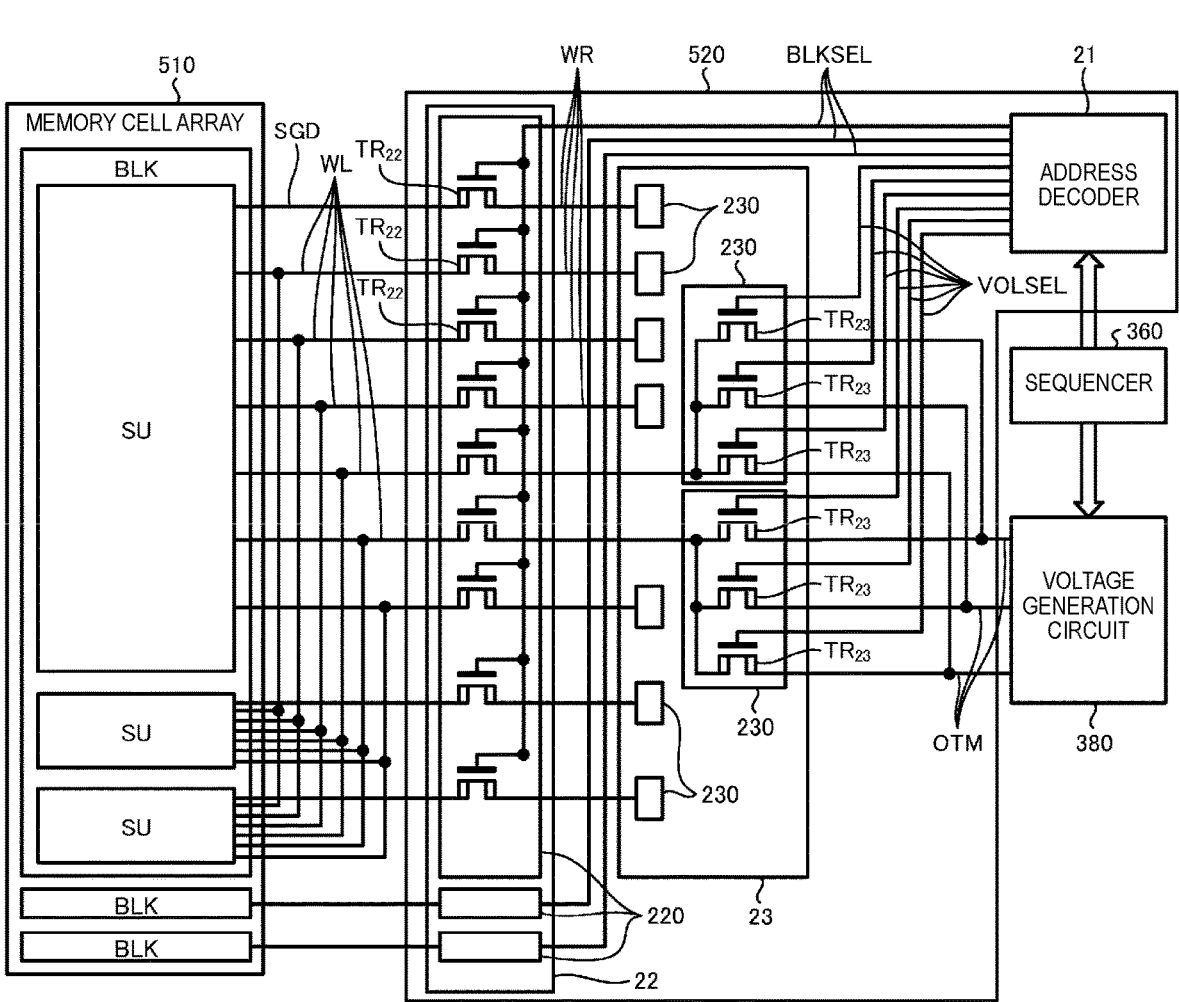
FIG. 4 is a circuit diagram showing an example of a configuration of a row decoder provided in the semiconductor device according to the embodiment.

FIG. 4 is a circuit diagram showing an example of a configuration of a row decoder 520 provided in the semiconductor device 1 according to the embodiment.

As shown in FIG. 4, the row decoder 520 includes an address decoder 21, a block select circuit 22, and a voltage select circuit 23.

The address decoder 21 includes a plurality of block select lines BLKSEL and a plurality of voltage select lines VOLSEL.

The address decoder 21 refers to the address data of the address register 340 provided in the peripheral circuit described above, for example, in accordance with a control signal from the sequencer 360.

The address decoder 21 decodes the referenced address data to turn on the transistors $TR_{22}$ and $TR_{23}$ corresponding to the address data and turn off the rest of transistors $TR_{22}$ and $TR_{23}$. The transistor $TR_{22}$ and the transistor $TR_{23}$ are transistors provided in a block select circuit 22 and a voltage select circuit 23, which will be described later, respectively.

Further, the address decoder 21 sets the voltage of the block select line BLKSEL and the voltage select line VOLSEL corresponding to the address data to, for example, the "H" state, and sets the rest of voltages to the "L" state. The voltages applied to these wirings are inverted depending on whether the block select circuit 22 and the voltage select circuit 23 use either the N-channel type or P-channel type transistor. The above-described voltages are an example when the transistors are of the N-channel type.

In the example of FIG. 4, one block select line BLKSEL is provided in the address decoder 21 for each block BLK in the memory cell array 510. However, this configuration may be changed as appropriate. For example, one block select line BLKSEL may be provided for each of two or more blocks BLK.

The block select circuit 22 includes a plurality of block selection portions 220 corresponding to the blocks BLK of the memory cell array 510. Each of the plurality of the block selection portions 220 includes a plurality of transistors $TR_{22}$ corresponding to the word lines WL and the select gate lines (SGD, SGS).

The transistor $TR_{22}$ is a high breakdown voltage N-channel MOS transistor and functions as a block driving transistor. Each of the drain electrodes of the transistors $TR_{22}$ is electrically connected to the corresponding word lines WL or select gate lines (SGD, SGS). Each of the source electrodes of the transistors $TR_{22}$ is electrically connected to the voltage output terminal OTM via the wiring WR and the voltage select circuit 23. The gate electrode of the transistor $TR_{22}$ is commonly connected to the corresponding block select line BLKSEL.

The block select circuit 22 further includes a plurality of transistors (not shown). The plurality of transistors are high breakdown voltage CMOS transistors connected between the select gate lines (SGD, SGS) and the ground voltage supply terminal. The plurality of transistors cause the select gate lines (SGD, SGS) provided in the non-selected block BLK in the memory cell array 510 to be conductive to the ground voltage supply terminal. A plurality of word lines WL provided in the non-selected block BLK enter a floating state.

The voltage select circuit 23 includes a plurality of voltage selection portions 230 corresponding to the word lines WL and select gate lines (SGD, SGS). Each of the plurality of voltage selection portions 230 includes a plurality of transistors $TR_{23}$.

The transistor $TR_{23}$ is a high breakdown voltage N-channel MOS transistor and functions as a voltage select transistor. Each of drain terminals of the transistors $TR_{23}$ is electrically connected to the corresponding word lines WL or select gate lines (SGD, SGS) via the wiring WR and the block select circuit 22. Each of the source terminals is electrically connected to the corresponding voltage output terminal OTM. Each of the gate electrodes is connected to the corresponding voltage select line VOLSEL.

The above-described high breakdown voltage CMOS transistor including the high breakdown voltage P-channel MOS transistor and the high breakdown voltage N-channel MOS transistor is a transistor to which a relatively high voltage is applied and is also referred to as a high voltage (HV: High Voltage) MOS transistor.

As described above, the row decoder 520 belonging to the peripheral circuit includes a plurality of transistors $TR_{22}$, $TR_{23}$, and the like. It is noted that the circuit configuration of the row decoder 520 shown in FIG. 4 is an example, and the number and type of transistors $TR_{22}$, $TR_{23}$, and the like provided in the row decoder 520 may also vary.

Physical Configuration of Semiconductor Device

Next, an example of the physical configuration of the semiconductor device of the embodiment will be described with reference to FIGS. 5 and 6.

Schematic Configuration of Semiconductor Device

Figure 5:
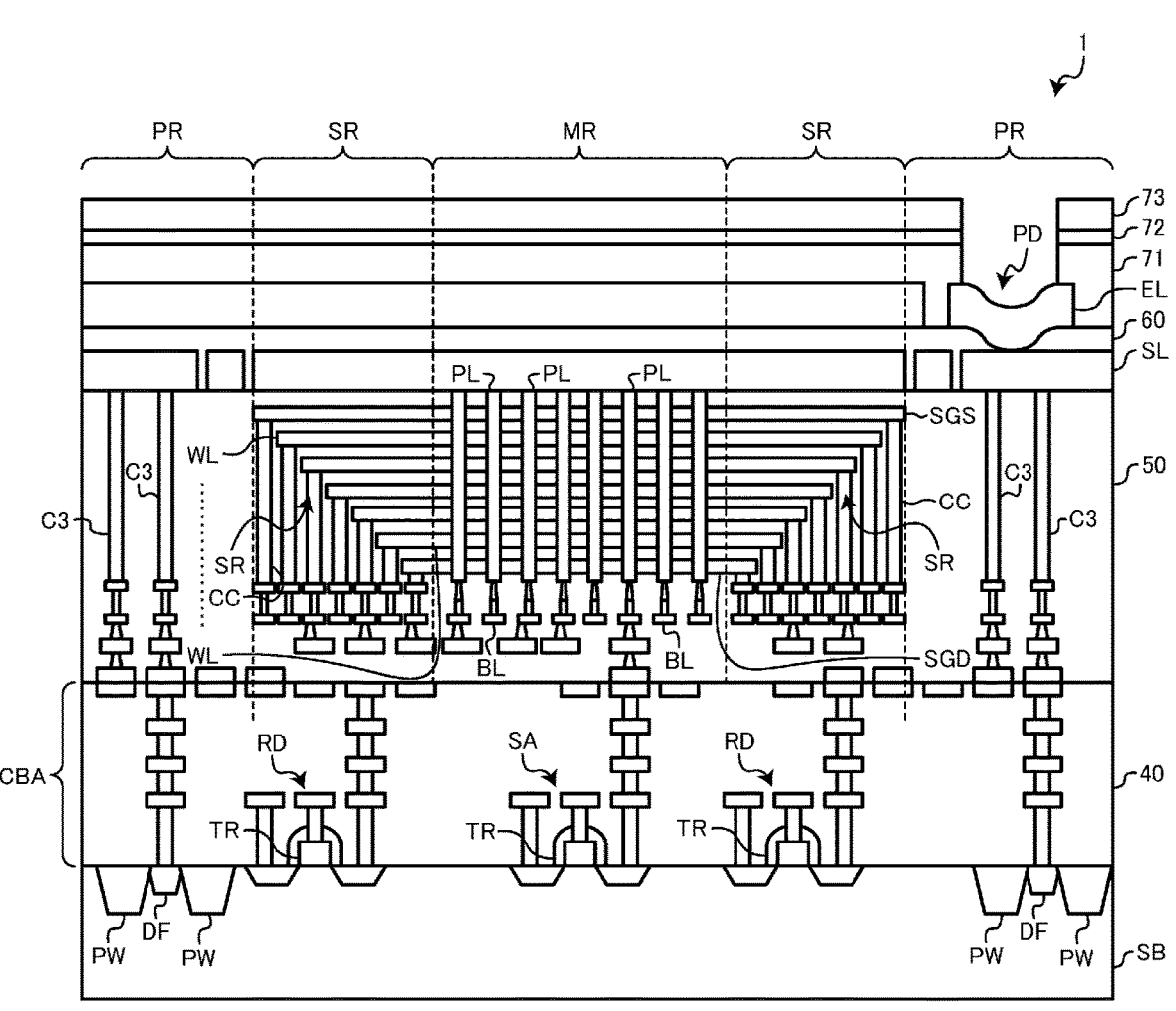
FIG. 5 is a sectional view showing a schematic configuration example of the semiconductor device according to the embodiment.

FIG. 5 is a sectional view showing a schematic configuration example of the semiconductor device 1 according to the embodiment. In FIG. 5, hatching is omitted in consideration of the visibility of the drawing.

As shown in FIG. 5, the semiconductor device 1 includes a peripheral circuit CBA, a plurality of word lines WL, and the like through which pillars PL are formed, a source line SL, and an electrode layer EL in this order above the semiconductor substrate SB. In the following description, the side where the semiconductor substrate SB is provided is referred to as the lower side of the semiconductor device 1.

The semiconductor substrate SB is, for example, a silicon substrate, and the like. Here, the semiconductor substrate SB is, for example, a diced silicon substrate. In addition, the semiconductor substrate SB may be a part of the silicon substrate, such as a silicon substrate that is thinned to several hundred nm.

The peripheral circuit CBA including a sense amplifier module SA, a row decoder RD, and the like, is provided on the semiconductor substrate SB. The sense amplifier module SA and the row decoder RD in FIG. 5 are examples of the physical configurations of the sense amplifier module 530 and the row decoder 520 described above, respectively.

The peripheral circuit CBA has at least some transistors TR on the semiconductor substrate SB, and contacts, vias, and wiring lines provided in a plurality of layers are connected to these transistors TR. The peripheral circuit CBA including these transistors TR, contacts, vias, and wirings is covered with the insulating layer 40.

On both ends of the semiconductor substrate SB outside the sense amplifier module SA and the row decoder RD, an N+ diffusion region DF sandwiched on both sides by P wells PW is provided. The semiconductor substrate SB and the source line SL described above are electrically connected to each other through the N+ diffusion region DF and through contacts, vias, wirings, or the like provided in the plurality of layers above the N+ diffusion region DF. Alternatively, the peripheral circuit CBA may include the P wells PW and the N$^+$ diffusion regions DF in addition to the contacts, vias, and wirings, which are connected to the N$^+$ diffusion region DF.

Above the insulating layer 40, at least one select gate line SGD, a plurality of word lines WL, and at least one select gate line SGS are stacked apart from each other in this order. The plurality of word lines WL and the select gate lines SGD and SGS, which are conductive layers, are covered with the insulating layer 50, and are bonded to the insulating layer 40 covering the peripheral circuit CBA via the insulating layer 50.

The insulating layer 50 also extends around the plurality of word lines WL, and the like. In the insulating layer 50, contacts C3 extending through the insulating layer 50 in the stacking direction of the plurality of word lines WL are provided. The contact C3 is electrically connected to the above-mentioned N$^+$ diffusion region DF provided in the semiconductor substrate SB. As a result, the semiconductor substrate SB and the source line SL are electrically connected to each other.

A memory region MR is provided in a central portion in a direction in which the plurality of word lines WL extend, and a stepped region SR is provided at both ends of the plurality of word lines WL and the select gate lines SGD and SGS. A peripheral region PR is provided outside the plurality of word lines WL.

In the memory region MR, a plurality of pillars PL through which the word lines WL and the select gate lines SGD and SGS penetrate in the stacking direction are provided. A memory cell MC is formed at an intersection between the pillar PL and the word line WL, and a select gate transistor STD and a select gate transistor STS are formed at an intersection between the pillar PL and the select gate lines SGD and SGS, respectively. Accordingly, the semiconductor device 1 is configured as, for example, a three-dimensional nonvolatile memory in which memory cells MC are arranged in three dimensions in the memory region MR.

As described above, the memory region MR is an example of a physical configuration corresponding to the memory cell array 510 (refer to FIG. 2). Further, the pillar PL is an example of a physical configuration corresponding to the above-described memory string MS (refer to FIG. 2) in which the memory cells MC and the like are connected in series.

In the physical configuration of the semiconductor device 1, the pillar PL is electrically connected to the sense amplifier module SA of the peripheral circuit CBA via the bit line BL or the like provided below the pillar PL. Therefore, the above-described sense amplifier module SA is, for example, provided on the semiconductor substrate SB at a position vertically overlapping with the memory region MR where the bit line BL to be connected is provided.

In the stepped region SR, both ends of the plurality of word lines WL and the select gate lines SGD and SGS are processed in a stepped shape. As a result, the widths of both ends of the plurality of word lines WL and the like are wider toward the upper source line SL. A contact CC is connected to each layer at the step portion of the plurality of word lines WL and the select gate lines SGD and SGS.

The electrical connections to the word lines WL and the select gate lines SGD and SGS, which are stacked in multiple layers, individually extend out through these contacts CC. These contacts CC are used to apply a write voltage, a read voltage, and the like to the memory cells MC provided in the memory region MR at the central portion in the extension direction of the plurality of word lines WL, via the word lines WL at the same height position as the memory cells MC.

Various voltages applied from the contacts CC to the memory cells MC are controlled by the row decoder RD of the peripheral circuit CBA electrically connected to these contacts CC. Therefore, the above-described row decoder RD is, for example, provided on the semiconductor substrate SB at a position vertically overlapping with the stepped region SR where the contact CC to be connected is provided.

Above the plurality of word lines WL, the source line SL is provided. The electrode layer EL is provided on the source line SL via an insulating layer 60 such as a silicon oxide layer. The electrode layer EL penetrates the insulating layer 60 in some regions and has a pad region PD that maintains electrical continuity with the source line SL.

The electrode layer EL is covered with a plurality of insulating layers 71 to 73 stacked in this order from the electrode layer EL side on the upper surface excluding the pad region PD. The insulating layer 71 is, e.g., a silicon oxide layer, the insulating layer 72 is, e.g., a silicon nitride layer, and the insulating layer 73 is, e.g., a polyimide layer.

With such a configuration, the source potential can be applied to the source line SL from the outside of the semiconductor device 1 via the electrode layer EL.

Configuration Example of Peripheral Circuit

Figure 6:
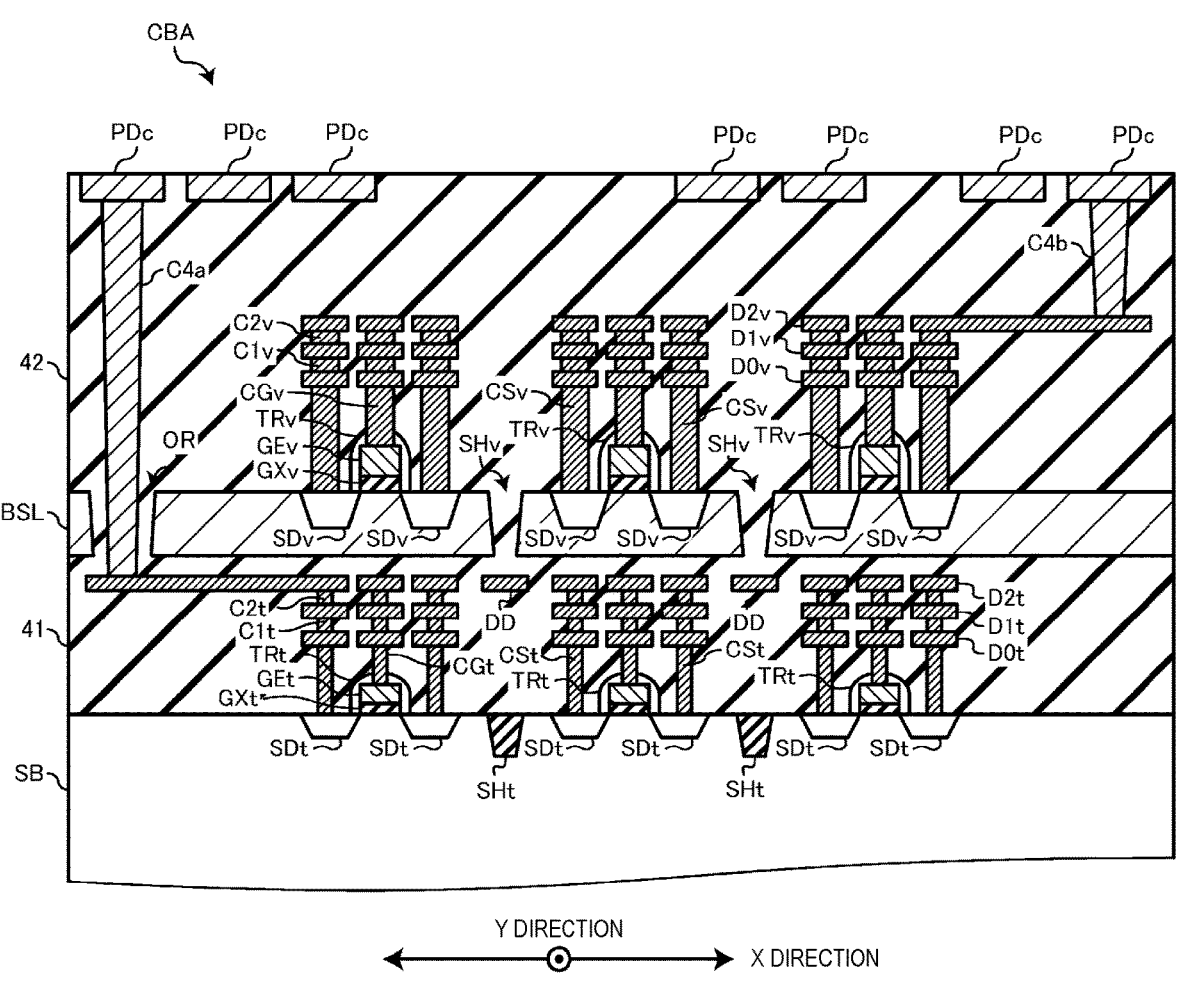
FIG. 6 is a sectional view showing an example of a configuration of a peripheral circuit provided in the semiconductor device according to the embodiment.

FIG. 6 is a sectional view showing an example of a configuration of the peripheral circuit CBA provided in the semiconductor device 1 according to the embodiment.

The X direction and the Y direction shown in FIG. 6 are directions orthogonal to each other. In addition, in FIG. 6, the X direction is defined as a direction orthogonal to the extension direction of the gate electrodes GEt and GEv to be described later, that is, a direction along the gate length of the gate electrodes GEt and GEv. In addition, the Y direction is a direction along the gate width of the gate electrodes GEt and GEv.

As shown in FIG. 6, the peripheral circuit CBA includes transistors TRt provided on the semiconductor substrate SB and transistors TRv provided on the semiconductor layer BSL.

Each of the plurality of transistors TRt includes a gate insulating layer GXt, a gate electrode GEt, and a source/drain region SDt.

The gate insulating layer GXt and the gate electrode GEt are provided on the semiconductor substrate SB in this order. The gate electrode GEt of each transistor TRt, together with the gate insulating layer GXt, is disposed to be spaced apart from each other in the X direction and extends along the Y direction. That is, the distance of the gate electrode GEt along the X direction corresponds to the gate length of the gate electrode GEt in the transistor TRt, and the distance of the gate electrode GEt along the Y direction corresponds to the gate width of the gate electrode GEt in the transistor TRt.

The gate electrode GEt is, for example, a tungsten layer, a nickel-platinum silicide layer, or the like. The source/drain region SDt is provided in the semiconductor substrate SB at positions vertically overlapping with both ends of the gate electrode GEt in the X direction.

These transistors TRt are configured as, for example, low voltage (LV, VLV) MOS transistors to which a relatively low voltage is applied. In addition, these transistors TRt are provided in the circuits that interface with external devices, such as the sense amplifier module SA of the peripheral circuit CBA, and the input/output circuit 310, the logic control circuit 320, and the ready/busy circuit 370 in FIG. 1.

A high-speed operation is required for the transistors TRt used in these circuits serving as interfaces. The above-described tungsten layer, nickel-platinum silicide layer, or the like used for the gate electrode GEt of the transistor TRt is suitable for a gate electrode material of a low voltage MOS transistor where a high-speed operation is required and having a relatively short gate length.

It is preferable that these gate electrodes GEt are provided on the semiconductor substrate SB such that the longitudinal direction of the gate electrode GEt, that is, the gate width direction, intersects with the plane orientation of a (110) plane provided in the semiconductor substrate SB. When the transistor TRt is a P-channel MOS transistor or the like, the carrier mobility in the semiconductor substrate SB can be further increased by taking such a positional relationship between the plane orientation of the semiconductor substrate SB and the gate width direction of the gate electrode GEt.

A region of the semiconductor substrate SB between the plurality of transistors TRt is provided with a separation layer SHt that electrically separates these transistors TRt from each other. Since the transistor TRt is, for example, a low voltage MOS transistor, the depletion layer generated below the transistor TRt also remains at a relatively shallow position of the semiconductor substrate SB. Therefore, the separation layer SHt can also be formed relatively shallow.

At least a surface layer portion of the semiconductor substrate SB provided with the source/drain regions SDt of the plurality of transistors TRt, the separation layers SHt for separating the plurality of transistors TRt, and the like may be referred to herein as a semiconductor layer. The layer thickness of the semiconductor substrate SB in a portion including the source/drain regions SDt, the separation layers SHt, and the like is, for example, about several hundred nm.

The plurality of transistors TRt are covered with the insulating layer 41. The insulating layer 41 constitutes a part of the insulating layer 40 in FIG. 5. In the insulating layer 41, the contacts CGt and CSt, the wirings D0t to D2t, and the vias C1t and C2t, which are connected to these transistors TRt, are provided over a plurality of layers.

A contact CGt extending through the insulating layer 41 from above the transistor TRt is connected to the gate electrode GEt of each transistor TRt. A contact CSt extending through the insulating layer 41 from above the transistor TRt is connected to the source/drain region SDt of each transistor TRt.

A wiring D0t, a via C1t, a wiring D1t, a via C2t, and a wiring D2t are connected to these contacts CGt and CSt in order from the lower layer side. In addition, a dummy wiring DD is provided in a region between the plurality of transistors TRt in the same layer as the uppermost layer wiring D2t. The dummy wiring DD is not connected to other wirings or the like and is in a floating state.

The semiconductor layer BSL is provided on the insulating layer 41 covering these configurations. The semiconductor layer BSL is, for example, a polysilicon layer or the like, and has a thickness of, for example, several hundred nm. A plurality of transistors TRv are provided on the semiconductor layer BSL as described above.

Each of the plurality of transistors TRv includes a gate insulating layer GXv, a gate electrode GEv, and a source/drain region SDv.

The gate insulating layer GXv and the gate electrode GEv are provided on the semiconductor layer BSL in this order. The gate electrode GEv of each transistor TRv, together with the gate insulating layers GXv, is disposed to be spaced apart from each other in the X direction and extends along the Y direction. As described above, the manufacturing process of the semiconductor device 1 can be simplified by aligning the longitudinal direction of the gate electrode GEv with the longitudinal direction of the gate electrode GEt of the transistor TRt described above.

In the gate electrode GEv of the transistor TRv formed on the semiconductor layer BSL, it is possible to disregard the relationship with the above-mentioned plane orientation of the semiconductor substrate SB. Therefore, the longitudinal direction of the gate electrode GEv of the transistor TRv may not necessarily align with the longitudinal direction of the gate electrode GEt of the transistor TRt.

The gate insulating layer GXv is, for example, a tungsten silicide layer, a tungsten nitride layer, or the like. The source/drain region SDv is provided in the semiconductor layer BSL at positions vertically overlapping with both ends of the gate electrode GEv in the X direction.

These transistors TRv are configured as, for example, high voltage (HV) MOS transistors to which a relatively high voltage is applied. The transistors TRv are not required to operate at a high speed, unlike some of the low voltage MOS transistors. Therefore, as the gate electrode GEv of the transistor TRv, a gate electrode material that is relatively easily processed such as the tungsten silicide layer or the tungsten nitride layer described above can be used, as compared with a tungsten layer or a nickel-platinum silicide layer used as a gate electrode material of a low voltage MOS transistor.

In addition, the transistor TRv to which a high voltage is applied is configured to have, for example, a breakdown voltage higher than that of the transistor TRt described above.

Specifically, the gate insulating layers GXv of these transistors TRv are formed to be thicker than, for example, the gate insulating layers GXt of the transistors TRt described above. In addition, the gate electrodes GEv of these transistors TRv have a gate length longer than the gate electrodes GEt of the transistors TRt described above, for example.

These transistors TRv are provided in, for example, a row decoder RD or the like of the peripheral circuit CBA. As described above, similarly to how the transistor TRt is provided in the sense amplifier module SA, and the transistor TRv is provided in the row decoder RD, each of the transistors TRt and TRv may be provided in different circuits and may have different connection destinations. Therefore, in FIG. 6, these transistors TRv are provided at positions vertically overlapping with the above-described transistors TRt, but the arrangement of the transistors TRt and TRv is not limited thereto.

When the transistor TRt is, for example, a transistor provided in the sense amplifier module SA, these transistors TRt may be provided below the memory region MR where the above-described pillars PL are provided. In addition, when the transistor TRv is, for example, a transistor provided in the row decoder RD, these transistors TRv may be provided below the above-mentioned stepped region SR out to which the word lines WL and the select gate lines SGD and SGS extend.

A region of the semiconductor substrate SB between the plurality of transistors TRv is provided with a separation layer SHv that electrically separates these transistors TRv from each other. The separation layer SHv penetrates the semiconductor layer BSL, and the above-mentioned dummy wiring DD is provided below the separation layer SHv.

As described above, by providing the separation layer SHv to penetrate the semiconductor layer BSL provided on the insulating layer 41, the leakage current that would flow between the plurality of transistors TRv when flowing around the lower side of the separation layer SHv is prevented.

The plurality of transistors TRv are covered with the insulating layer 42. The insulating layer 42, together with the insulating layer 41 described above, also constitutes a part of the insulating layer 40 in FIG. 5. In the insulating layer 42, the contacts CGv and CSv, the wirings D0v to D2v, and the vias C1v and C2v, which are connected to these transistors TRv, are provided over a plurality of layers.

A contact CGv extending through the insulating layer 42 from above the transistor TRv is connected to the gate electrode GEv of each transistor TRv. A contact CSv extending through the insulating layer 42 from above the transistor TRv is connected to the source/drain region SDv of each transistor TRv.

These contacts CGv and CSv, to which a high voltage is applied to the transistor TRv, may have areas at least at their lower ends that are larger than areas of the lower ends of the above-mentioned contacts CGt and CSt connected to the transistor TRt. By having such a large connection area, a high voltage can be applied to the transistor TRv by the contacts CGv and CSv.

In addition, a high voltage is also applied to a wiring D0v to be described later, which is connected to the contact CGv and the contact CSv. Therefore, in order to reduce the parasitic capacitance between the wiring D0v and the semiconductor layer BSL, the contact CSv connected to the source/drain region SDv may be configured to be longer in the extension direction than the contact CSt connected to the source/drain region SDt of the transistor TRt. As a result, it is possible to increase the distance between the wiring D0v and the semiconductor layer BSL, so that the influence of parasitic capacitance can be reduced.

A wiring D0v, a via C1v, a wiring D1v, a via C2v, and a wiring D2v are connected to these contact CGv and CSv in order from the lower layer side.

In addition, a plurality of electrode pads PDc are provided on the upper surface of the insulating layer 42. The electrode pad PDc is electrically connected to a configuration including the above-described pillars PL, the word lines WL, and the select gate lines SGD and SGS. Through-contacts C4a and C4b extend through the insulating layers 41 and 42 from the electrode pads PDc.

The through-contact C4a extends from the electrode pad PDc, through the insulating layer 42, the opening OR provided in the semiconductor layer BSL, and the insulating layer 41, and is connected to the wiring D2t of the transistor TRt. Although not shown in FIG. 6, the through-contact C4a is connected to the wiring D2t of each transistor TRt. As a result, electrical connection to each transistor TRt extends out to the electrode pad PDc and connected to the pillar PL or the like.

The through-contact C4b extends through the insulating layer 42 from the electrode pad PDc, and is connected to the wiring D2v of the transistor TRv. Although not shown in FIG. 6, the through-contact C4v is connected to the wiring D2v of each transistor TRv. As a result, electrical connection to each transistor TRv can extend out to the electrode pad PDc and connected to the word lines WL and the select gate lines SGD and SGS.

Method for Manufacturing Semiconductor Device

Next, a method for manufacturing the semiconductor device 1 according to the embodiment will be described with reference to FIGS. 7A to 7C, FIGS. 8A to 8C, and FIGS. 9A and 9B, which are sectional views sequentially showing a part of a procedure of a method for manufacturing the semiconductor device 1 according to the embodiment.

Figures 7A, 7B, 7C:
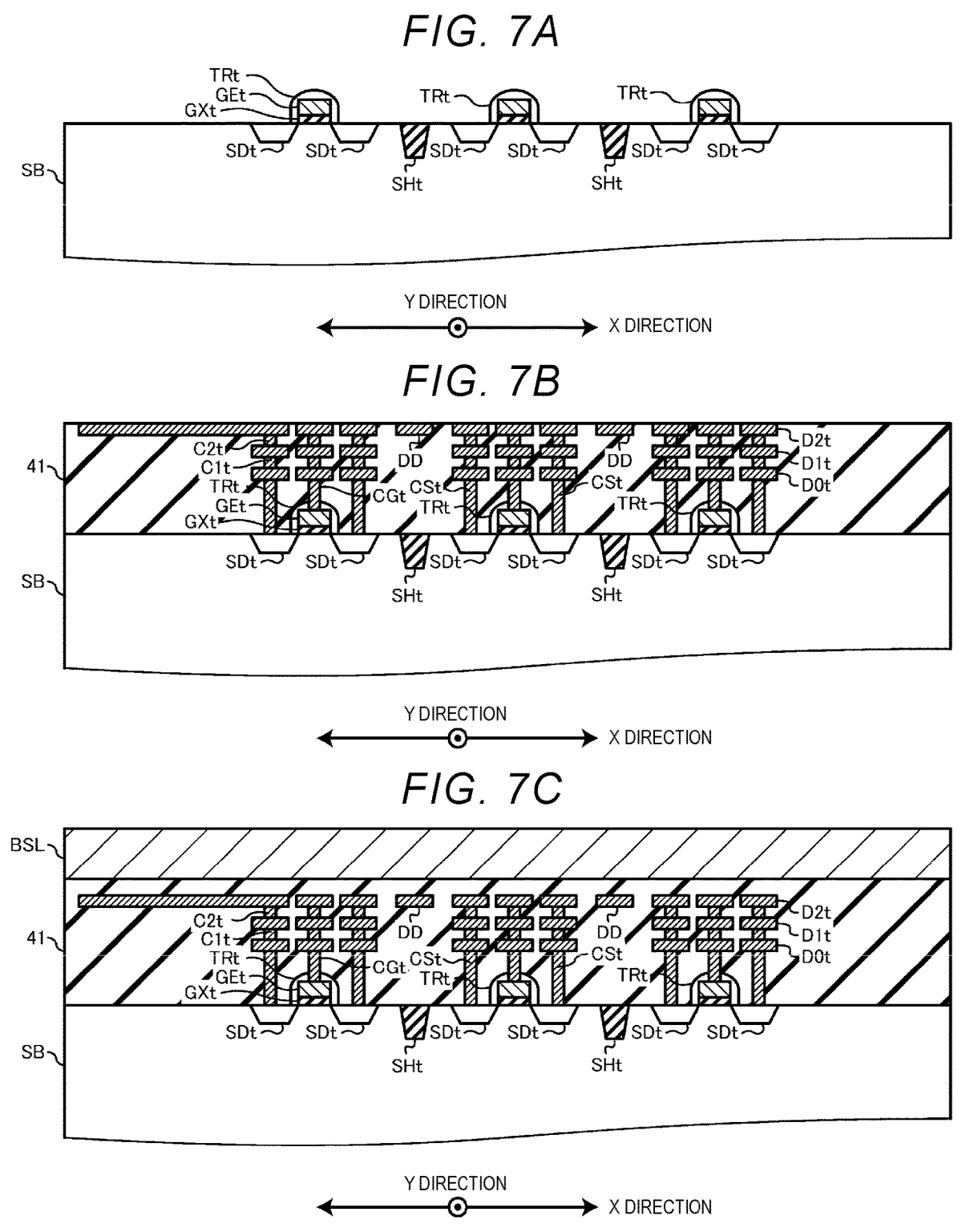

As shown in FIG. 7A, a semiconductor substrate SB is prepared. In this case, it is preferable to use the semiconductor substrate SB having the plane orientation of a (100) plane with the notch as a reference. Such a semiconductor substrate SB is also referred to as a 45° notch substrate in which the notch is rotated by 45° with respect to a substrate having the plane orientation of a (110) plane with the notch as a reference.

A separation layer SHt is formed on the semiconductor substrate SB. The separation layer SHt is formed, for example, by forming a groove in the semiconductor substrate SB and embedding an insulating layer in the groove. In addition, the gate insulating layer GXt and the gate electrode GEt are formed in this order in each region separated by the separation layer SHt of the semiconductor substrate SB.

The gate insulating layer GXt and the gate electrode GEt usually have a long length in a direction along the horizontal direction or the vertical direction with the notch of the semiconductor substrate SB facing downward. As described above, for example, by using the semiconductor substrate SB having the plane orientation of a (100) plane with respect to the notch as a reference, the longitudinal direction of the gate electrode GEt can be made to intersect with the plane orientation of a (110) plane of the semiconductor substrate SB.

A source/drain region SDt is formed in the semiconductor substrate SB. The source/drain region SDt is formed by, for example, injecting a predetermined conductive dopant into the semiconductor substrate SB by a self-alignment method using the gate electrode GEt and annealing the semiconductor substrate SB.

From the above, the plurality of transistors TRt are formed on the semiconductor substrate SB.

As shown in FIG. 7B, the contact CGt, the contact CSt, the wiring D0t, the via C1t, the wiring D1t, the via C2t, and the wiring D2t, which are connected to the transistor TRt, are sequentially formed while forming the insulating layer 41 covering the transistor TRt for each layer. In addition, the dummy wiring DD that is not connected to any wiring or the like in parallel with the wiring D2t is formed in the same layer as the wiring D2t.

As shown in FIG. 7C, the insulating layer 41 is further formed on the uppermost layer of the wiring D2t, and the semiconductor layer BSL is formed on the insulating layer 41.

Figures 8A, 8B, 8C:
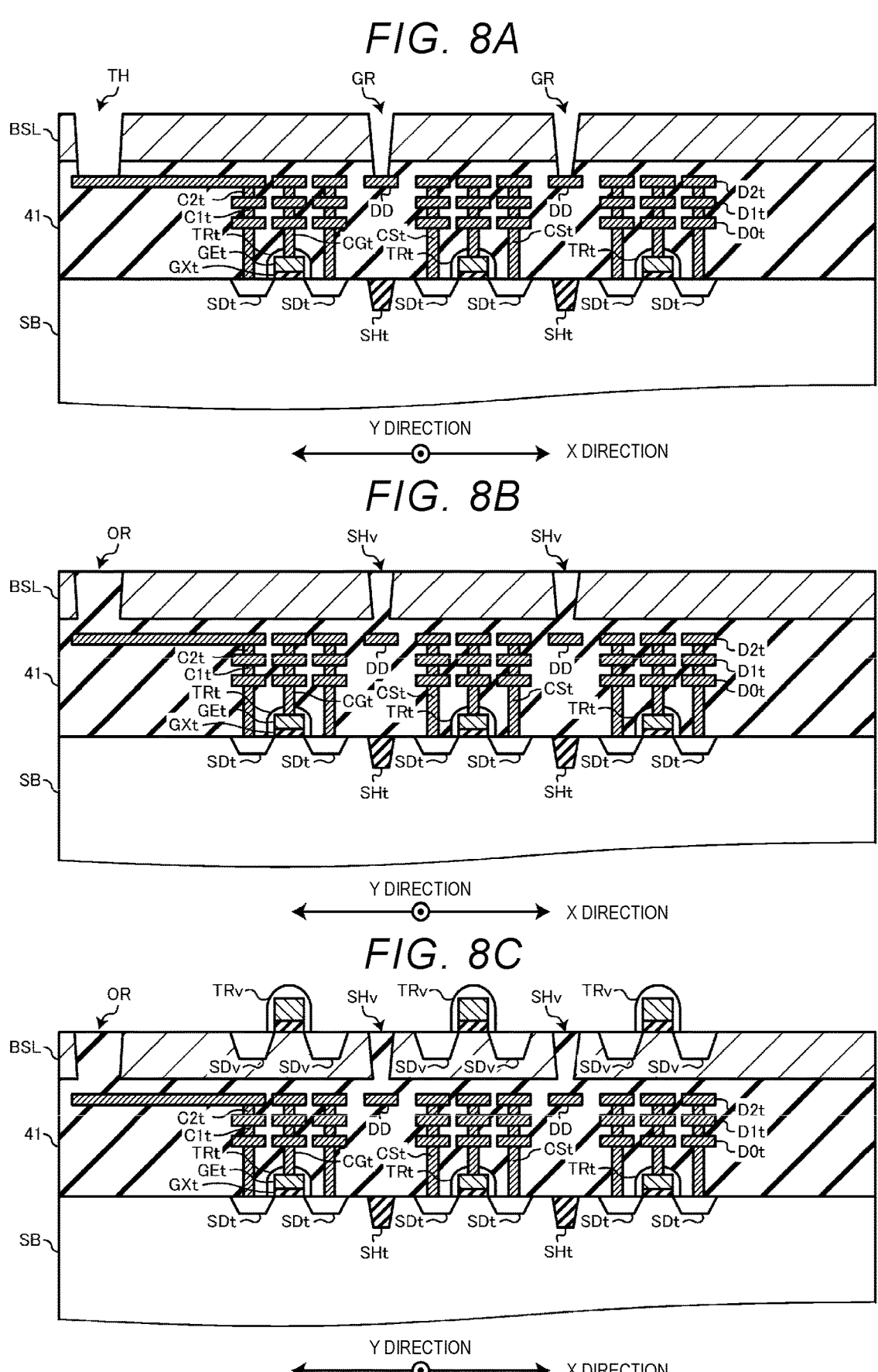
FIGS. 8A to 8C are diagrams sequentially showing a part of the procedure of the method for manufacturing the semiconductor device according to the embodiment.

As shown in FIG. 8A, a groove GR and a through via hole TH that penetrate through the semiconductor layer BSL are formed. The groove GR is provided between each region where a plurality of transistors TRv are to be formed.

At this time, the groove GR is formed by using the dummy wiring DD below the semiconductor layer BSL as a stopper layer, resulting in the groove GR having a lower end on the dummy wiring DD. The through via hole TH is provided outside the region where the plurality of transistors TRv are to be formed. At this time, the through via hole TH is formed by using the wiring D2t below the semiconductor layer BSL as a stopper layer, resulting in the through via hole TH having a lower end on the wiring D2t.

As shown in FIG. 8B, the insulating layer is filled in the groove GR and the through via hole TH of the semiconductor layer BSL to form the separation layer SHv and the opening OR, respectively.

As shown in FIG. 8C, the gate insulating layer GXv and the gate electrode GEv are formed in this order in each region separated by the separation layer SHv of the semiconductor layer BSL. The source/drain region SDv is formed in the semiconductor layer BSL by a self-alignment method using the gate electrode GEv, for example.

As a result, the plurality of transistors TRv are formed on the semiconductor layer BSL.

Figure 9A:
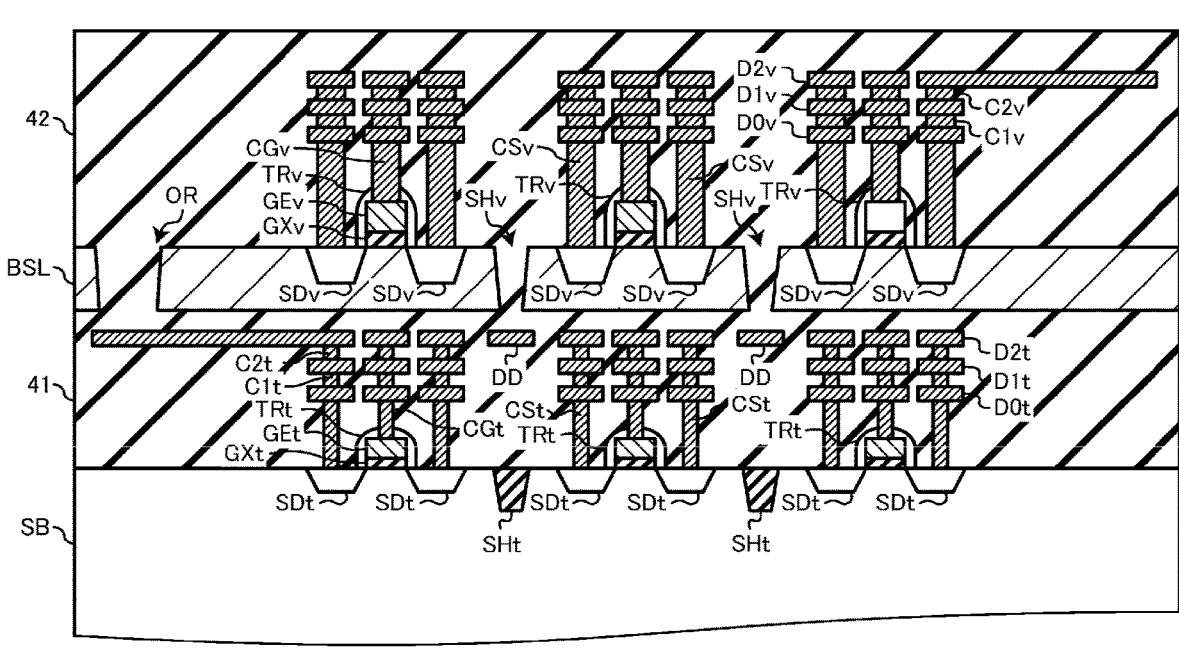
FIGS. 9A to 9B are diagrams sequentially showing a part of the procedure of the method for manufacturing the semiconductor device according to the embodiment.

As shown in FIG. 9A, the contact CGv, the contact CSv, the wiring D0v, the via C1v, the wiring D1v, the via C2v, and the wiring D2v, which are connected to the transistor TRv, are sequentially formed while forming the insulating layer 42 covering the transistor TRv for each layer. The insulating layer 42 is further formed on the uppermost layer wiring D2v.

Figure 9B:
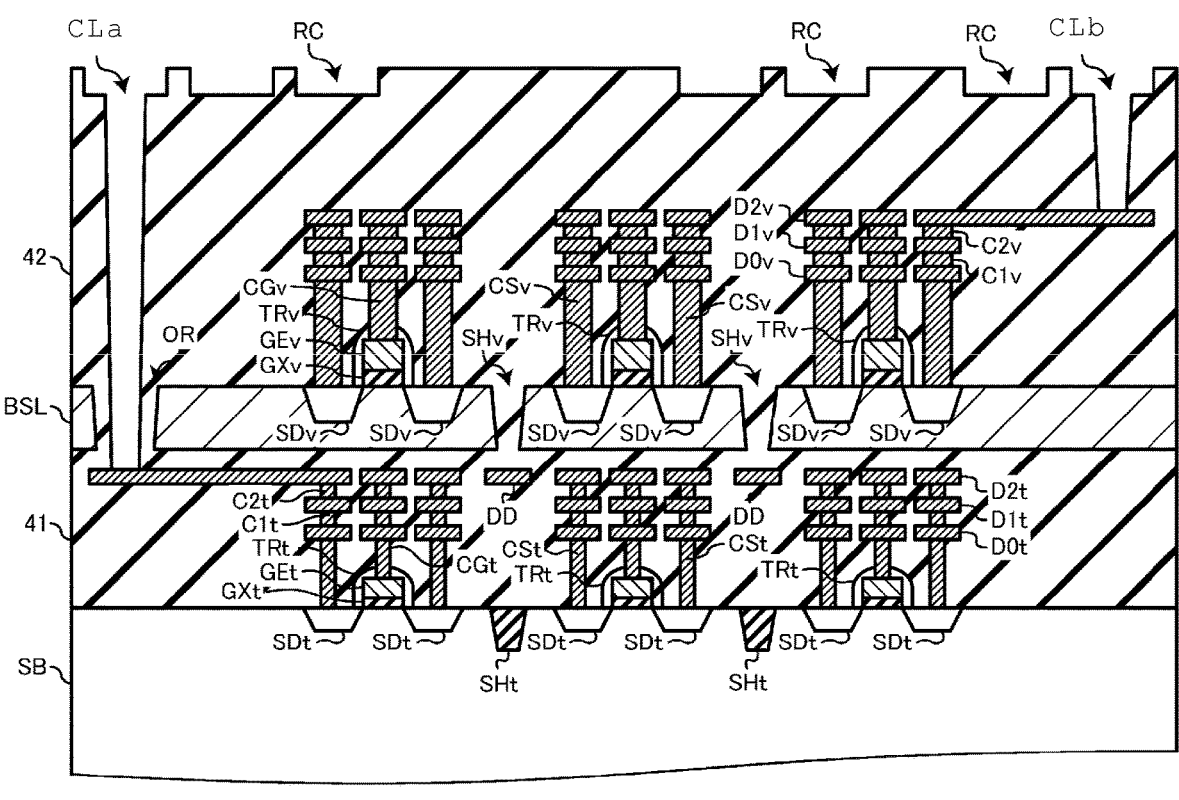

As shown in FIG. 9B, a plurality of grooves RC and contact holes CLa and CLb extending from the grooves RC through the insulating layers 41 and 42 are formed on the surface of the insulating layer 42. The contact hole CLa extends through the insulating layer 42, the opening OR provided in the semiconductor layer BSL, and the insulating layer 41, and reaches the wiring D2t of the transistor TRt. The contact hole CLb extends through the insulating layer 42, and reaches the wiring D2v of the transistor TRv.

It is preferable that the contact holes CLa and CLb are formed separately from each other since the contact holes CLa and CLb have different reach depths.

Thereafter, the electrode pads PDc and the through-contacts C4a and C4b are formed by filling the grooves RC and the contact holes CLa and CLb with the conductive layer.

In the example shown in FIG. 9B, the electrode pads PDc and the through-contacts C4a and C4b are collectively formed using a dual damascene method. However, the electrode pads PDc and the through-contacts C4a and C4b may be individually formed.

Hereinafter, the insulating layer 40 covering the transistors TRt and TRv formed on the semiconductor substrate SB and the insulating layer 50 covering the above-described pillars PL, the word lines WL, and the select gate lines SGD and SGS are bonded to each other. A configuration including the pillars PL, the word lines WL, and the select gate lines SGD and SGS is formed as follows.

On a supporting substrate, a source line SL is formed, and a plurality of sacrificial layers are further stacked apart from each other. The supporting substrate is, for example, a semiconductor substrate different from the semiconductor substrate SB, an insulating substrate such as a ceramic substrate or a quartz substrate, or a conductive substrate such as an alumina substrate. The sacrificial layers are subsequently replaced with a conductive layer such as a tungsten layer or a molybdenum layer and becomes the word lines WL and the select gate lines SGD and SGS.

Pillars PL penetrating the plurality of sacrificial layers are formed. An insulating layer 50 covering these pillars PL, the word lines WL, and the select gate lines SGD and SGS is formed.

As described above, after bonding the semiconductor substrate SB and the supporting substrate with the insulating layers 40 and 50, the supporting substrate is removed. Thereafter, the semiconductor substrate SB may be thinned to, for example, several hundred nm.

As described above, the semiconductor device 1 of the embodiment is manufactured.

Thereafter, the semiconductor device 1 may be packaged after stacking a plurality of thinned semiconductor substrates including the semiconductor substrate SB on which the transistors TRt and TRv are formed.

SUMMARY

A semiconductor device such as a three-dimensional nonvolatile memory including a peripheral circuit that controls the electrical operation of a memory cell, for example. The peripheral circuit includes a plurality of transistors formed on a semiconductor substrate. With the demand for increased memory capacity and a reduction in size of a semiconductor device, the number of transistors provided in the peripheral circuit and the density on the semiconductor substrate increases. However, this increases the difficulty of manufacturing a semiconductor device, and there is a limit to the high-density arrangement of a large number of transistors.

According to the semiconductor device 1 of the embodiment, the plurality of transistors TRt provided on the semiconductor substrate SB and the plurality of transistors TRv provided on the semiconductor layer BSL are provided. As a result, the layout area for these transistors TRt and TRv can be increased across the entirety of the semiconductor substrate SB and the semiconductor layer BSL, without increasing the layout area for the plurality of transistors TRt and TRv on the semiconductor substrate SB. Therefore, the size of the semiconductor device 1 can be reduced without excessively increasing the density of the transistors TRt and TRv.

According to the semiconductor device 1 of the embodiment, the semiconductor device 1 includes a separation layer SHv that penetrates the semiconductor layer BSL between the plurality of transistors TRv and separates the plurality of transistors TRv from each other.

Since the separation layer SHv is formed by penetrating the semiconductor layer BSL provided in the insulating layer 41, it is possible to prevent the leakage current flowing from the lower side of the separation layer SHv, so that the performance of the transistor TRv can be improved.

In addition, with the separation layer SHv having such a configuration, it is possible to form the semiconductor layer BSL in a thin layer having, for example, several hundred nm while preventing the leakage current, so that it is easier to further reduce the size of the semiconductor device 1.

According to the semiconductor device 1 of the embodiment, the semiconductor device 1 further includes a dummy wiring DD in a floating state provided between the semiconductor substrate SB and the semiconductor layer BSL and at a position vertically overlapping with the separation layer SHv.

When forming the separation layer SHv, it is possible to form the groove GRv penetrating the semiconductor layer BSL by using the dummy wiring DD as a stopper layer. Therefore, the reach depth of the groove GRv in the insulating layer 41 can be precisely controlled by the height position of the dummy layer DD.

According to the semiconductor device 1 of the embodiment, the dummy wiring DD is provided at the same height position as the plurality of wirings D2t electrically connected to the plurality of transistors TRt. As described above, by providing the layer of the dummy layer DD, for example, in the same layer as the wiring D2t, it is possible to form the dummy layer DD collectively when forming the wiring D2t, so that the manufacturing process of the semiconductor device 1 can be simplified.

According to the semiconductor device 1 of the embodiment, the transistor TRt is a low voltage MOS transistor, and the transistor TRv is a high voltage MOS transistor.

As described above, between the single-crystal semiconductor substrate SB and the semiconductor layer BSL which is a polysilicon layer or the like, a higher carrier mobility can be obtained in the semiconductor substrate SB. Therefore, by providing the transistor TRt for low voltage where a high-speed operation is required in some applications on the semiconductor substrate SB, the operational performance of the transistor TRt can be improved.

With the above configuration, for example, the transistor TRv for high voltage is not formed on the semiconductor substrate SB. Therefore, for example, when the semiconductor substrate SB is thinned to further reduce the size of the semiconductor device 1, it is not necessary to maintain the thickness of the semiconductor substrate SB to several m or less in consideration of the influence of the depletion layer due to the transistor TRv for high voltage.

That is, in the transistor TRt, since the depletion layer formed in the semiconductor substrate SB is also relatively small in thickness, the semiconductor substrate SB can be thinned to, for example, several hundred nm. As a result, the size of the semiconductor device 1 can be further reduced. In addition, when manufacturing a semiconductor package or the like by stacking a plurality of semiconductor substrates including the semiconductor substrate SB on which the transistors TRt and TRv are formed, the number of stacked semiconductor substrates can be increased.

In addition, by providing the transistors TRt and TRv in different layers, it is easy to make the gate electrode materials of the transistors TRt and TRv different according to the application of each of the transistors TRt and TRv.

According to the semiconductor device 1 of the embodiment, the distance in the extension direction of the contact CSt connected to the source/drain region SDt of the transistor TRt is shorter than the distance in the extension direction of the contact CSv connected to the source/drain region SDv of the transistor TRv.

As described above, a high voltage is applied to the wiring D0v provided above the source/drain region SDv and connected to the transistor TRv for high voltage. By forming the contact CSv for high voltage to be longer than the contact CSt for low voltage, the distance between the wiring D0v connected on the contact CSv and the semiconductor layer BSL can be increased. Therefore, the parasitic capacitance between the wiring D0v and the semiconductor layer BSL can be reduced.

At this time, as described above, the transistors TRt and TRv are provided in different layers, so that the lengths of the contacts CSt and CSv connected to the transistors TRt and TRv can be appropriately configured.

According to the semiconductor device 1 of the embodiment, the contact CSt connected to the source/drain region SDt of the transistor TRt has an area at least at its lower end that is smaller than an area of the lower end of the contact CSv connected to the source/drain region SDv of the transistor TRv.

The diameter of the contact CSt that applies a low voltage to the transistor TRt for low voltage may be smaller than the diameter of the contact CSv that applies a high voltage to the transistor TRv for high voltage, for example.

Here, by providing the transistors TRt and TRv in different layers, the contact CSt connected to the transistor TRt is shorter than the contact CSv connected to the transistor TRv. Therefore, when the contact hole is formed in the insulating layer 41 to form the contact CSt, it is possible to prevent an excessive increase in the aspect ratio of the contact hole even when the diameter is reduced.

As described above, by providing the transistors TRt and TRv in different layers, it is also easy to reduce the diameter of the contact CSt of the transistor TRt.

According to the semiconductor device 1 of the embodiment, the gate electrode GEt of the transistor TRt has a gate width in a direction intersecting the (110) plane of the semiconductor substrate SB. As a result, the carrier mobility in the semiconductor substrate SB can be further increased, and the transistor TRt can be operated in a constrained manner.

Modification Example

Next, a semiconductor device of a modification example of the embodiment will be described with reference to FIGS. 10 and 11. The semiconductor device of the modification example is different from the above-described embodiment in that the semiconductor device includes a plurality of semiconductor layers BSLb and BSLc.

In the following figures, the same symbol is attached to the same configuration as that in described-above embodiment, and the description may be omitted.

Figure 10:
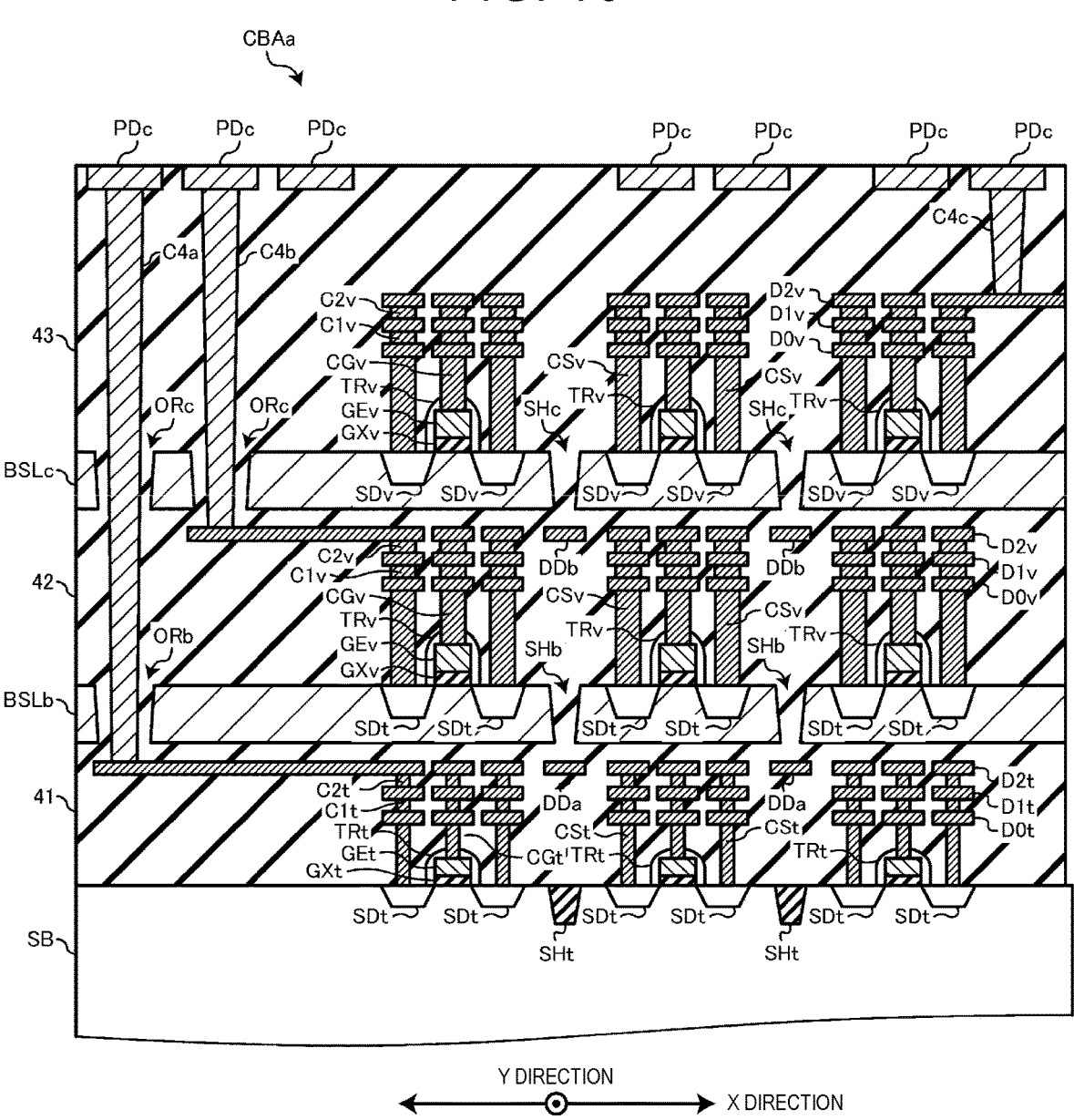
FIG. 10 is a sectional view showing an example of a configuration of a peripheral circuit provided in a semiconductor device according to a modification example of the embodiment.

FIG. 10 is a sectional view showing an example of a configuration of a peripheral circuit CBAa provided in a semiconductor device according to the modification example of the embodiment.

As shown in FIG. 10, the peripheral circuit CBAa includes transistors TRt provided on the semiconductor substrate SB, transistors TRv provided on the semiconductor layer BSLb, and transistors TRv provided on the semiconductor layer BSLc.

The configuration including the plurality of transistors TRt provided on the semiconductor substrate SB is the same as the above-described embodiment. That is, the semiconductor substrate SB includes a plurality of transistors TRt, a separation layer SHt, as well as contacts CGt and CSt, wirings D0t to D2t, and vias C1t and C2t, which are connected to the transistors TRt.

Dummy wirings DDa are formed between the wirings D2t corresponding to the plurality of transistors TRt. The dummy wiring DDa is in a floating state as in the dummy wiring DD of the above-described embodiment, and is provided at a position vertically overlapping with the separation layer SHb to be described later, which is provided in the semiconductor layer BSLb of the upper layer.

At least a surface layer portion of the semiconductor substrate SB provided with the source/drain regions SDt of the plurality of transistors TRt, the separation layers SHt for separating the plurality of transistors TRt, and the like is referred to as a semiconductor layer.

A semiconductor layer BSLb such as a polysilicon layer having a thickness of, for example, several hundred nm is provided on the insulating layer 41 covering the semiconductor substrate SB. A plurality of transistors TRv are provided on the semiconductor layer BSLb as described above.

The configuration including the plurality of transistors TRv provided on the semiconductor layer BSLb is the same as the above-described embodiment. That is, the semiconductor layer BSLb includes a plurality of transistors TRv, a separation layer SHb that penetrates the semiconductor layer BSLb, as well as contacts CGv and CSv, wirings D0v to D2v, and vias C1v and C2v, which are connected to the transistors TRv.

Dummy wirings DDb are formed between the wirings D2v corresponding to the plurality of transistors TRv. The dummy wiring DDb is in a floating state as in the dummy wiring DD of the above-described embodiment, and is provided at a position vertically overlapping with the separation layer SHc to be described later, which is provided in the semiconductor layer BSLc of the upper layer.

A semiconductor layer BSLc such as a polysilicon layer having a thickness of, for example, several hundred nm is provided on the insulating layer 42 covering the semiconductor substrate SB. As described above, the transistors TRv are provided on the semiconductor layer BSLc.

The configuration including the plurality of transistors TRv provided on the semiconductor layer BSLc is the same as the above-described embodiment. That is, the semiconductor layer BSLc includes a plurality of transistors TRv, a separation layer SHc that penetrates the semiconductor layer BSLc, as well as contacts CGv and CSv, wirings D0v to D2v, and vias C1v and C2v, which are connected to the transistors TRv.

These configurations provided in the semiconductor layer BSLc are covered with the insulating layer 43. The insulating layer 43, together with the insulating layers 41 and 42, constitutes a part of the insulating layer 40 shown in FIG. 5 of the above-described embodiment, for example. A plurality of electrode pads PDc are provided on the upper surface of the insulating layer 43, and an insulating layer 50 covering the above-described pillars PL, the word lines WL, and the select gate lines SGD and SGS is bonded to the insulating layer 43.

Through-contacts C4a to C4c extend through the insulating layers 41 and 42 from the plurality of electrode pads PDc provided on the insulating layer 43.

The through-contact C4a extends from the electrode pad PDc through the insulating layer 43, the opening ORc provided in the semiconductor layer BSLc, the insulating layer 42, the opening ORb provided in the semiconductor layer BSLb, and the insulating layer 41, and is connected to the wiring D2t of the transistor TRt provided in the semiconductor substrate SB. As a result, the electrical connection of each transistor TRt can extend out to the electrode pad PDc.

The through-contact C4b extends from the electrode pad PDc through the insulating layer 43, the opening ORc provided in the semiconductor layer BSLc, and the insulating layer 42, and is connected to the wiring D2v of the transistor TRv provided in the semiconductor layer BSLb. As a result, the electrical connection of each transistor TRv can extend out to the electrode pad PDc.

The through-contact C4c extends from the electrode pad PDc through the insulating layer 43, and is connected to the wiring D2v of the transistor TRv provided in the semiconductor layer BSLc. As a result, the electrical connection of each transistor TRv can extend out to the electrode pad PDc.

As described above, the plurality of semiconductor layers BSLb and BSLc are provided above the semiconductor substrate SB, and the plurality of transistors TRv are arranged in each of the semiconductor layers BSLb and BSLc. In this manner, the layout area for the transistors TRv can be further increased without increasing the entirety of the layout area of peripheral circuit CBA.

Figure 11:
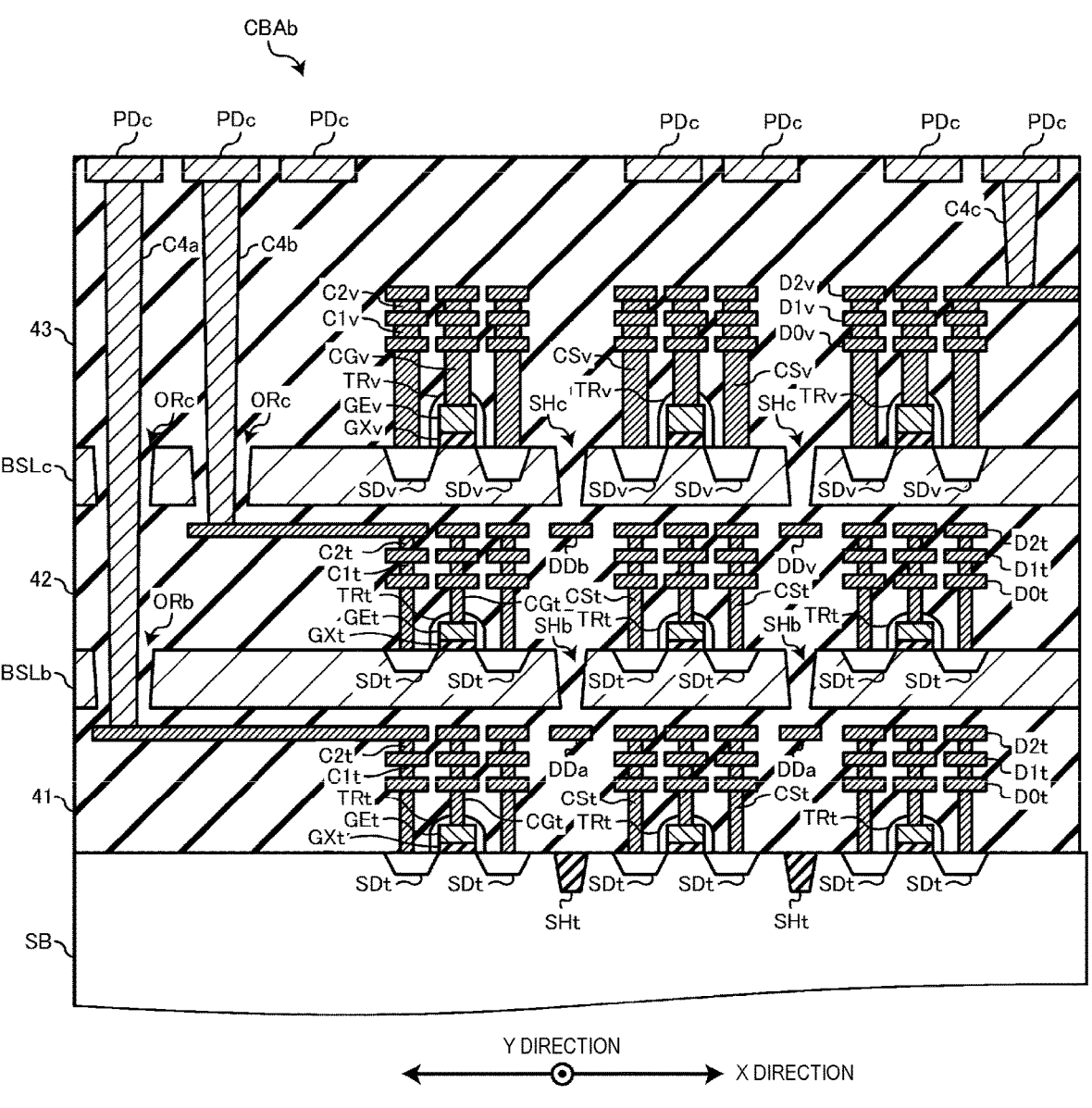
FIG. 11 is a sectional view showing another example of the configuration of the peripheral circuit provided in the semiconductor device according to the modification example of the embodiment.

FIG. 11 is a sectional view showing another example of the configuration of the peripheral circuit CBAb provided in the semiconductor device according to the modification example of the embodiment.

As shown in FIG. 11, the peripheral circuit CBAb includes transistors TRt provided on the semiconductor substrate SB, transistors TRt provided on the semiconductor layer BSLb, and transistors TRv provided on the semiconductor layer BSLc.

The configuration including the plurality of transistors TRt provided on the semiconductor substrate SB is the same as the above-described embodiment. Dummy wirings DDa are formed between the wirings D2t corresponding to the plurality of transistors TRt.

A semiconductor layer BSLb is provided on the insulating layer 41 covering the semiconductor substrate SB. A plurality of transistors TRt are provided on the semiconductor layer BSLb as described above.

The configuration including the plurality of transistors TRt provided on the semiconductor layer BSLb is configured in substantially the same manner as the configuration including the plurality of transistors TRt provided on the semiconductor substrate SB. That is, the semiconductor layer BSLb includes a plurality of transistors TRt, as well as contacts CGt and CSt, wirings D0t to D2t, and vias C1t and C2t, which are connected to the transistors TRt. The separation layer SHt is however replaced with the separation layer SHb that penetrates the semiconductor layer BSLb.

Dummy wirings DDb are formed between the wirings D2t corresponding to the plurality of transistors TRt.

A semiconductor layer BSLc is provided on the insulating layer 42 covering the semiconductor layer BSLb. A plurality of transistors TRv are provided on the semiconductor layer BSLc as described above.

The configuration including the plurality of transistors TRv provided on the semiconductor layer BSLc is the same as the above-described embodiment.

As described above, a high-speed operation is required for some transistors TRt used in the input/output circuit 310, the logic control circuit 320, the ready/busy circuit 370, and the like (refer to FIG. 1) that serve as interfaces with external devices. Therefore, it is desirable for these transistors TRt to be provided on the semiconductor substrate SB, instead of the semiconductor layers BSLb and BSLc, where the carrier mobility is high.

However, for example, an operation speed as high as that of the transistors TRt for the interface is not required for the transistors TRt used in the sense amplifier module SA and the like. Therefore, by providing a plurality of semiconductor layers BSLb and BSLc above the semiconductor substrate SB and arranging a plurality of transistors TRt and TRv on each of the semiconductor layers BSLb and BSLc, it is easier to further secure the layout area for the transistors TRt where a high-speed operation is required on the semiconductor substrate SB.

According to the semiconductor device of the modification example, other effects similar to those of the semiconductor device 1 of the above-described embodiment are obtained. Other Modification Examples In the above-described embodiment and modification example, the semiconductor device 1 was designed to be assembled by bonding the semiconductor substrate SB provided with the transistors TRt and TRv and the supporting substrate provided with the pillars PL, the word lines WL, and the select gate lines SGD and SGS. However, the semiconductor device 1 may have other configurations. Another configuration example of the semiconductor device is shown in FIG. 12.

Figure 12:
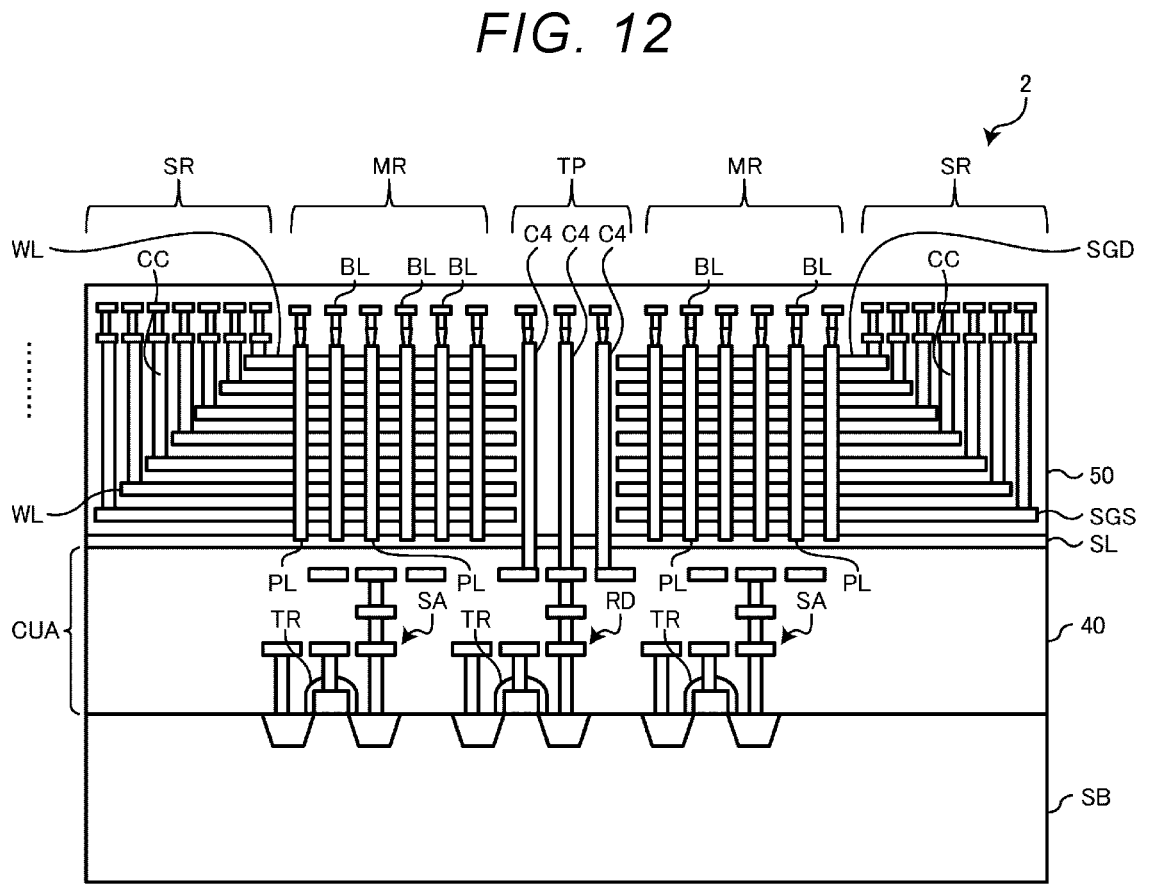

FIG. 12 is a sectional view showing a schematic configuration example of a semiconductor device 2 of another embodiment.

As shown in FIG. 12, the semiconductor device 2 includes a peripheral circuit CUA, a memory region MR, a through-contact region TP, and a stepped region SR on the semiconductor substrate SB. The side where the semiconductor substrate SB is provided is referred to as the lower side of the semiconductor device 2.

On the semiconductor substrate SB, for example, a transistor TR having a circuit configuration shown in FIG. 1 described above is provided, and a peripheral circuit CUA covered with the insulating layer 40 is provided. Some of the transistors TR of the peripheral circuit CUA are also provided on the semiconductor substrate SB. In addition, the other part of the transistors TR are provided in the semiconductor layer BSL (refer to FIG. 6) described above, which is formed in the insulating layer 40 above the semiconductor substrate SB. A source line SL is provided on the insulating layer 40.

At least one select gate line SGD, a plurality of word lines WL, and at least one select gate line SGS are stacked apart from each other in this order on the source line SL. These configurations are also covered with the insulating layer 50. The plurality of word lines WL and the like are provided with a plurality of memory regions MR, a through-contact region TP between the memory regions MR, and stepped regions SR at both ends of the word lines WL and the like.

In the memory region MR, a plurality of pillars PL through which the word lines WL and the select gate lines SGD and SGS penetrate in the stacking direction are provided. A plurality of memory cells MC are formed at an intersection between the pillar PL and the word line WL. The pillar PL is electrically connected to the bit line BL provided above the pillar PL.

With such a configuration, the semiconductor device 2 is also configured as, for example, a three-dimensional nonvolatile memory in which the memory cells MC are arranged in three dimensions in the memory region MR.

The stepped region SR has a configuration in which a plurality of word lines WL and select gate lines SGD and SGS extend to form a stepped shape, and a plurality of contacts CC are provided on the step portions. These contacts CC are electrically connected to upper-layer wirings provided above the contacts CC.

In the through-contact region TP provided between the plurality of memory regions MR, for example, a through-contact C4 that connects the peripheral circuit CUA provided on the lower semiconductor substrate SB and the upper-layer wiring of the contact CC is provided. Accordingly, a row decoder RD is provided, for example, at a position vertically overlapping with the through-contact C4.

The semiconductor device 2 includes other through-contact regions (not shown in FIG. 12). In at least one of these through-contact regions, a through-contact (not shown) that connects the peripheral circuit CUA provided on the lower semiconductor substrate SB and the bit line BL of the pillar PL is provided. Accordingly, the sense amplifier SA is provided, for example, at a position vertically overlapping with the through-contact connected to the bit line BL.

Various through-contacts including the through-contact C4 of the through-contact region TP have the same function as the through-contact C4 of the above-described embodiment also in other embodiments of the semiconductor device.

That is, the through-contact C4 and the like of other embodiments are connected to the wirings D2t, D2v, and the like (refer to FIG. 6) electrically connected to the peripheral circuit CUA at their lower ends. In addition, the through-contact C4 of other embodiments is connected to the bit line BL of the pillar PL, the upper-layer wiring of the contact CC, and the like at its upper end. As a result, the through-contact C4 and the like also electrically connect the configuration such as the pillar PL, the plurality of word lines WL, the select gate lines SGD and SGS to the peripheral circuit CUA.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first semiconductor layer;
a plurality of first transistors provided on the first semiconductor layer;
an insulating layer provided on the first semiconductor layer and covering the plurality of first transistors;
a second semiconductor layer provided in the insulating layer;
a plurality of second transistors provided on the second semiconductor layer; and
a separation layer that extends through the second semiconductor layer between the plurality of second transistors to separate the plurality of second transistors from each other.

2. The semiconductor device according to claim 1, further comprising:
a dummy wiring in a floating state provided between the first and second semiconductor layers and at a position vertically overlapping with the separation layer.

3. The semiconductor device according to claim 1, wherein
each of the plurality of first transistors includes a first gate electrode and a first gate insulating layer, and
each of the plurality of second transistors includes a second gate electrode having a gate length longer than a gate length of the first gate electrode and a second gate insulating layer having a thickness that is greater than a thickness of the first gate insulating layer.

4. The semiconductor device according to claim 3, wherein
each of the plurality of first transistors includes first source/drain regions provided in the first semiconductor layer to vertically overlap with both ends of the first gate electrode in a direction of the gate length of the first gate electrode, and first contacts in contact with the first source/drain regions and extending vertically from the first source/drain regions by a first distance, and
each of the plurality of second transistors includes second source/drain regions provided in the second semiconductor layer to vertically overlap with both ends of the second gate electrode in a direction of the gate length of the second gate electrode, and second contacts in contact with the second source/drain regions and extending vertically from the second source/drain regions by a second distance that is greater than the first distance.

5. The semiconductor device according to claim 4, wherein a surface of each of the first contacts in contact with the corresponding first source/drain region has an area that is smaller than an area of a surface of each of the second contacts in contact with the corresponding second source/drain region.

6. The semiconductor device according to claim 3, wherein the first semiconductor layer has a plane orientation of a (110) plane, and the first gate electrode has a gate width in a direction intersecting the (110) plane.

7. The semiconductor device according to claim 3, further comprising:

a third semiconductor layer provided between the first and second semiconductor layers; and a plurality of third transistors provided on the third semiconductor layer.

8. The semiconductor device according to claim 7, further comprising:

another separation layer that extends through the third semiconductor layer between the plurality of third transistors to separate the plurality of third transistors from each other.

9. The semiconductor device according to claim 8, further comprising:

another dummy wiring in a floating state provided between the second and third semiconductor layers and at a position vertically overlapping with the another separation layer.

10. The semiconductor device according to claim 7, wherein each of the plurality of third transistors includes a third gate electrode having a gate length longer than the gate length of the first gate electrode and a third gate insulating layer having a thickness greater than the thickness of the first gate insulating layer.

11. The semiconductor device according to claim 7, wherein each of the plurality of third transistors includes a third gate electrode having a gate length shorter than the gate length of the second gate electrode and a third gate insulating layer having a thickness smaller than the thickness of the second gate insulating layer.

12. The semiconductor device according to claim 7, wherein the first transistors have lower breakdown voltages than the second and third transistors.

13. The semiconductor device according to claim 7, wherein the second transistors have higher breakdown voltages than the first and third transistors.

14. The semiconductor device according to claim 1, further comprising a memory cell array above insulating layer.

15. The semiconductor device according to claim 14, further comprising:

a plurality of bit lines connected to memory cell transistors of the memory cell array, between the memory cell array and the insulating layer; and a source line connected to the memory cell transistors, above the memory cell array.

16. The semiconductor device according to claim 14, further comprising:

a source line connected to the memory cell transistors, between the memory cell array and the insulating layer; and a plurality of bit lines connected to memory cell transistors of the memory cell array, above the memory cell array.

17. A semiconductor device comprising:

a memory cell array having a plurality of memory cell transistors;

a plurality of word lines connected to gates of the memory cell transistors;

a plurality of bit lines connected to the memory cell transistors;

a peripheral circuit for the memory cell array including a row decoder configured to control voltages applied to the word lines and a sense amplifier configured to control voltages applied to the bit lines;

a first semiconductor layer;

a plurality of transistors of the sense amplifier provided on the first semiconductor layer;

an insulating layer provided on the first semiconductor layer and covering the plurality of transistors of the sense amplifier;

a second semiconductor layer provided in the insulating layer; and a plurality of transistors of the row decoder provided on the second semiconductor layer.

18. The semiconductor device according to claim 17, wherein the peripheral circuit further includes an input/output circuit configured to exchange signals with a memory controller connected to pads of the semiconductor device, and a plurality of transistors of the input/output circuit are also provided on the first semiconductor layer.

19. The semiconductor device according to claim 17, further comprising:

a separation layer that extends through the second semiconductor layer between the plurality of transistors of the row decoder to separate the plurality of transistors of the row decoder from each other.

20. The semiconductor device according to claim 17, further comprising:

a third semiconductor layer provided between the first and second semiconductor layers; and a plurality of transistors provided on the third semiconductor layer.

\* \* \* \* \*